United States Patent
Lawrence et al.

(10) Patent No.: US 11,522,460 B2
(45) Date of Patent: Dec. 6, 2022

(54) OPTIMIZING THE CONTROL OF A HYSTERETIC POWER CONVERTER AT LOW DUTY CYCLES

(71) Applicant: Cirrus Logic International Semiconductor Ltd., Edinburgh (GB)

(72) Inventors: Jason W. Lawrence, Austin, TX (US); Graeme G. Mackay, Austin, TX (US); Sakkarapani Balagopal, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/152,053

(22) Filed: Jan. 19, 2021

(65) Prior Publication Data

US 2022/0029538 A1    Jan. 27, 2022

Related U.S. Application Data

(60) Provisional application No. 63/055,950, filed on Jul. 24, 2020.

(51) Int. Cl.
*H02M 3/158* (2006.01)
*G01R 19/165* (2006.01)
*H03K 5/24* (2006.01)
*H02M 1/00* (2006.01)

(52) U.S. Cl.
CPC .... *H02M 3/1584* (2013.01); *G01R 19/16538* (2013.01); *H03K 5/24* (2013.01); *H02M 1/0009* (2021.05); *H02M 1/0012* (2021.05)

(58) Field of Classification Search
None
See application file for complete search history.

(56) References Cited

U.S. PATENT DOCUMENTS

| | | |
|---|---|---|
| 5,248,524 A | 9/1993 | Soderlund |
| 5,617,016 A | 4/1997 | Borghi et al. |
| 5,757,167 A | 5/1998 | Arora et al. |
| 6,177,783 B1 | 6/2001 | Donohue |
| 6,597,158 B2 | 7/2003 | Umeda |
| 7,102,340 B1 | 9/2006 | Ferguson |
| 7,190,150 B2 | 3/2007 | Chen et al. |
| 7,906,939 B2 | 3/2011 | Kung et al. |

(Continued)

FOREIGN PATENT DOCUMENTS

| | | |
|---|---|---|
| CN | 110784140 A | 2/2020 |
| EP | 1919058 A2 | 5/2008 |

(Continued)

OTHER PUBLICATIONS

International Search Report and Written Opinion of the International Searching Authority, International Application No. PCT/US2021/039373, dated Sep. 22, 2021.

(Continued)

*Primary Examiner* — Jeffrey A Gblende
(74) *Attorney, Agent, or Firm* — Jackson Walker L.L.P.

(57) ABSTRACT

A method for controlling a current associated with a power converter may comprise controlling the current based on at least a peak current threshold level for the current and a valley current threshold level for the current, and further controlling the current based on a duration of time that the power converter spends in a switching state of the power converter.

20 Claims, 22 Drawing Sheets

(56) References Cited

U.S. PATENT DOCUMENTS

| | | | |
|---|---|---|---|
| 8,686,703 B2* | 4/2014 | Xi | H02M 3/158 |
| | | | 323/283 |
| 8,873,254 B2* | 10/2014 | Morris | H02M 3/335 |
| | | | 363/21.14 |
| 9,088,247 B2 | 7/2015 | Arno et al. | |
| 9,577,587 B2 | 2/2017 | Maru et al. | |
| 9,639,102 B2 | 5/2017 | Dally | |
| 9,742,393 B2 | 8/2017 | Pavao-Moreira et al. | |
| 10,263,523 B1 | 4/2019 | Sonntag et al. | |
| 10,476,392 B1 | 11/2019 | Matsuura et al. | |
| 10,673,423 B2 | 6/2020 | Forghani-Zadeh et al. | |
| 10,720,835 B2 | 7/2020 | King et al. | |
| 10,734,885 B2 | 8/2020 | King et al. | |
| 11,011,987 B2* | 5/2021 | Kanjavalappil Raveendranath | H02M 3/158 |
| 2001/0020802 A1 | 9/2001 | Kitagawa et al. | |
| 2005/0264268 A1 | 12/2005 | Ueno | |
| 2006/0139819 A1 | 6/2006 | May | |
| 2008/0129219 A1 | 6/2008 | Smith et al. | |
| 2008/0278136 A1 | 11/2008 | Murtojarvi | |
| 2009/0266397 A1 | 10/2009 | Gibson et al. | |
| 2010/0019702 A1 | 1/2010 | Jang et al. | |
| 2010/0156175 A1 | 6/2010 | Wei | |
| 2011/0075446 A1 | 3/2011 | Doutreloigne et al. | |
| 2011/0121653 A1 | 5/2011 | Hartular et al. | |
| 2012/0205974 A1 | 8/2012 | McCaslin et al. | |
| 2012/0268094 A1 | 10/2012 | Scaldaferri et al. | |
| 2013/0106188 A1 | 5/2013 | Ishibashi et al. | |
| 2014/0197814 A1 | 7/2014 | Shi et al. | |
| 2016/0064986 A1 | 3/2016 | Langlinais et al. | |
| 2017/0005647 A1 | 1/2017 | Pan et al. | |
| 2017/0072812 A1 | 3/2017 | Von Novak et al. | |
| 2019/0181754 A1 | 6/2019 | Ash et al. | |
| 2019/0181761 A1* | 6/2019 | Sano | H02M 3/155 |
| 2019/0222122 A1* | 7/2019 | Langlinais | H02M 3/158 |
| 2019/0245444 A1 | 8/2019 | Kimura | |
| 2020/0235712 A1 | 7/2020 | May et al. | |
| 2021/0083578 A1 | 3/2021 | King et al. | |
| 2021/0159798 A1 | 5/2021 | Mackay et al. | |
| 2021/0364560 A1 | 11/2021 | Holland et al. | |
| 2021/0367510 A1 | 11/2021 | Lawrence et al. | |
| 2021/0367513 A1 | 11/2021 | Mackay et al. | |
| 2021/0367514 A1 | 11/2021 | Lawrence et al. | |
| 2021/0367515 A1 | 11/2021 | Mackay et al. | |
| 2021/0367517 A1 | 11/2021 | Lawrence et al. | |

FOREIGN PATENT DOCUMENTS

| | | |
|---|---|---|
| EP | 2775599 A1 | 9/2014 |
| EP | 3214746 A1 | 9/2017 |
| EP | 3240171 A1 | 11/2017 |
| FR | 2851091 A1 | 8/2004 |
| GB | 2555902 A | 5/2018 |
| TW | 201228201 A | 7/2012 |
| WO | 2012135778 A1 | 10/2012 |
| WO | 2017027393 A1 | 2/2017 |
| WO | 2019135820 A1 | 7/2019 |

OTHER PUBLICATIONS

Yu, Yangwei: "Choosing the Boost with Bypass or Pass Through", Jun. 30, 2017, Retrieved from the Internet Sep. 10, 2021.

Texas Instruments: TPS61291 Loe IQ Boost Converter with Bypass Operation, Sep. 30, 2014, Retrieved from the Internet Sep. 10, 2021.

International Search Report and Written Opinion of the International Searching Authority, International Application No. PCT/US2020/041535, dated Oct. 14, 2021.

Search Report under Section 17, UKIPO, Application No. GB2106142.9, dated Oct. 20, 2021.

Combined Search and Examination Report under Sections 17 and 18(3), UKIPO, Application No. GB2106144.5, dated Oct. 25, 2021.

International Search Report and Written Opinion of the International Searching Authority, International Application No. PCT/US2021/041547, dated Nov. 2, 2021.

International Search Report and Written Opinion of the International Searching Authority, International Application No. PCT/US2021/041918, dated Nov. 10, 2021.

International Search Report and Written Opinion of the International Searching Authority, International Application No. PCT/US2021/041544, dated Nov. 10, 2021.

STmicroelectronics NV, AN4218—Hardware design guideline power supply and voltage measurement—Application Note, Doc ID 024014 Rev 3, 26 pages, Oct. 2015.

Freescale Semiconductor, Inc., Multimedia Applications Division, i.MX233 Power Management Unit and Battery Charger—Application Note, Document No. AN3883, Rev. 0, 36 pages, Jul. 2009.

Texas Instruments, TPS6128x Low-, Wide-Voltage Battery Front-End DC/DC Converter Single-Cell Li-Ion, Ni-Rich, Si-Anode Applications—Data sheet, SLVSBI1A, 57 pages, Oct. 2013, Revised Sep. 2014.

Texas Instruments, Designing Robust TPS65217 Systems for VIN Brownout—Application Report, 13 pages, Oct. 2017.

Renesas Electronics Corporation, Preventing Subsystem Brownouts in Mobile Devices—White Paper, 6 pages.

MFJ Enterprises, Inc., MFJ—Super Battery Booster—Model MFJ-4416C—Instruction Manual, Version 0A, 16 pages, 2017.

International Search Report and Written Opinion of the International Searching Authority, International Application No. PCT/US2020/056782, dated Mar. 4, 2021.

Van Vroonhoven, Caspar, A 0-to-60V-Input Vcm Coulomb Counter with Signal-Dependent Supply Current and ±0.5% Gain Inaccuracy from -50° C to 125° C, 2020 IEEE International Solid-State Circuits Conference, Feb. 19, 2020.

International Search Report and Written Opinion of the International Searching Authority, International Application No. PCT/US2021/029631, dated Jul. 23, 2021.

Qiu et al., "Digital Average Current-Mode Control of PWM DC-DC Converts without Current Sensors", IEEE Transactions on Industrial Electronics, IEEE Service Center, vol. 57, No. 5, May 10, 2010, Piscataway, NJ, USA.

International Search Report and Written Opinion of the International Searching Authority, International Application No. PCT/US2021/029584, dated Jul. 30, 2021.

International Search Report and Written Opinion of the International Searching Authority, International Application No. PCT/US2021/032474, dated Aug. 3, 2021.

Vinnikov et al., "Solar Optiverter—A Novel Hybrid Approach to the PHotovoltaic Module Level Power Electronics", IEEE Transactions on Industrial Electronics, IEEE Service Center, vol. 66, No. 5, May 1, 2019, pp. 3869-3880, Piscataway, NJ, USA.

International Search Report and Written Opinion of the International Searching Authority, International Application No. PCT/US2021/032496, dated Aug. 4, 2021.

International Search Report and Written Opinion of the International Searching Authority, International Application No. PCT/US2021/030932, dated Aug. 20, 2021.

International Search Report and Written Opinion of the International Searching Authority, International Application No. PCT/US2021/039356, dated Oct. 1, 2021.

International Search Report and Written Opinion of the International Searching Authority, International Application No. PCT/US2020/047237, dated Oct. 30, 2020.

Stala, Robert et al., "A Switched-Capacitor DC-DC Converter with Variable Number of Voltage Gains and Fault-Tolerant Operation", IEEE Transactions on Industrial Electronics, IEEE Service Center, Piscataway, NJ, US, vol. 66, No. 5, May 1, 2019.

International Search Report and Written Opinion of the International Searching Authority, International Application No. PCT/US2020/039509, dated Oct. 8, 2021.

\* cited by examiner

OPTIMIZING THE CONTROL OF A HYSTERETIC POWER CONVERTER AT LOW DUTY CYCLES

RELATED APPLICATION

The present disclosure claims priority to U.S. Provisional Patent Application Ser. No. 63/055,950 filed Jul. 24, 2020, which is incorporated by reference herein in its entirety.

FIELD OF DISCLOSURE

The present disclosure relates in general to circuits for electronic devices, including without limitation personal audio devices such as wireless telephones and media players, and more specifically, to prediction of a load current and a control current in a power converter using output voltage thresholds.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier.

A power converter may be used to provide supply voltage rails to one or more components in a device. Accordingly, it may be desirable to regulate an output voltage of a power converter with minimal ripple in the presence of a time-varying current and power load.

SUMMARY

In accordance with the teachings of the present disclosure, one or more disadvantages and problems associated with existing approaches to regulating an output voltage of a power converter may be reduced or eliminated.

In accordance with embodiments of the present disclosure, a method for controlling a current associated with a power converter may comprise controlling the current based on at least a peak current threshold level for the current and a valley current threshold level for the current, and further controlling the current based on a duration of time that the power converter spends in a switching state of the power converter.

In accordance with these and other embodiments of the present disclosure, a control circuit for controlling a current associated with a power converter may include threshold-based control circuitry configured to control the current based on at least a peak current threshold level for the current and a valley current threshold level for the current and timer-based control circuitry configured to control the current based on a duration of time that the power converter spends in a switching state of the power converter.

In accordance with embodiments of the present disclosure, a device may include a power converter and a control circuit for controlling a current associated with the power converter. The control circuit may include threshold-based control circuitry configured to control the current based on at least a peak current threshold level for the current and a valley current threshold level for the current and timer-based control circuitry configured to control the current based on a duration of time that the power converter spends in a switching state of the power converter.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
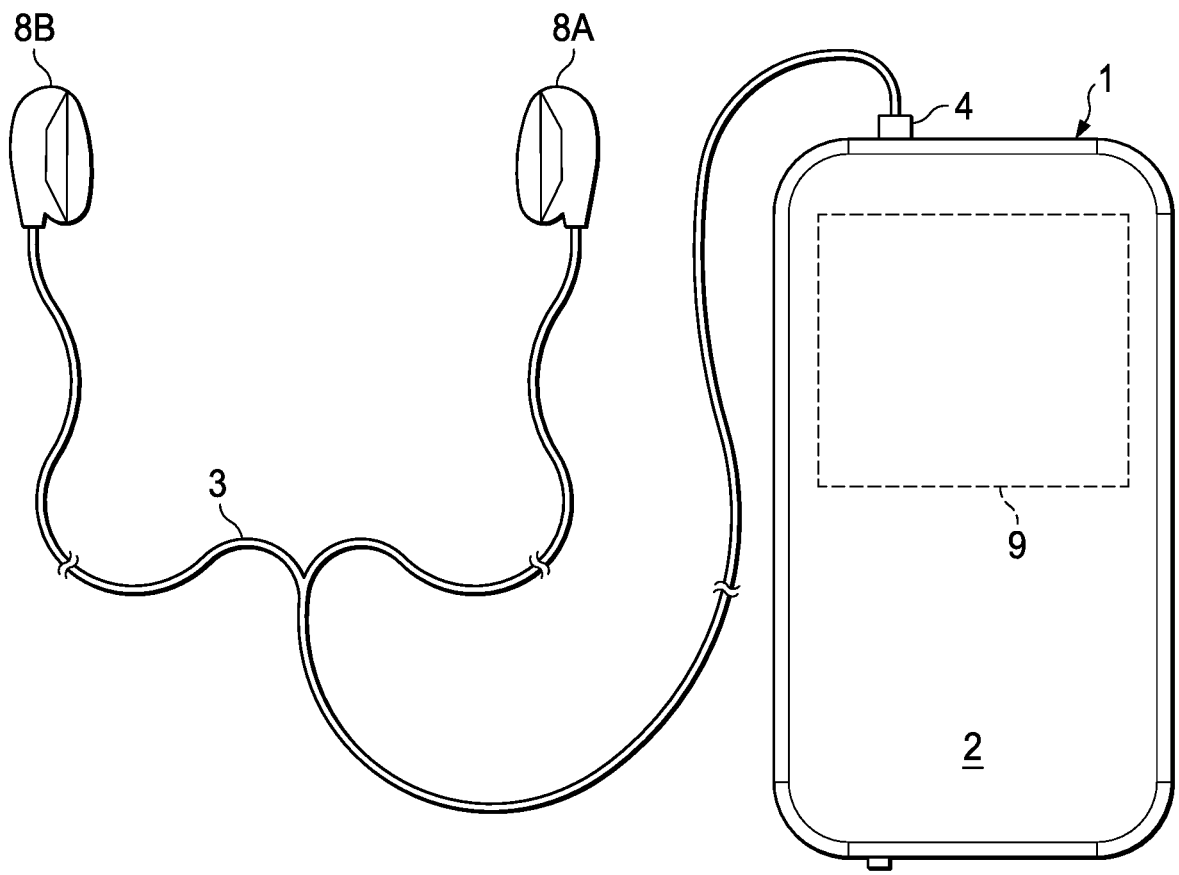
FIG. 1 illustrates an example mobile device, in accordance with embodiments of the present disclosure.

FIG. 1 illustrates an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1.

Figure 2:
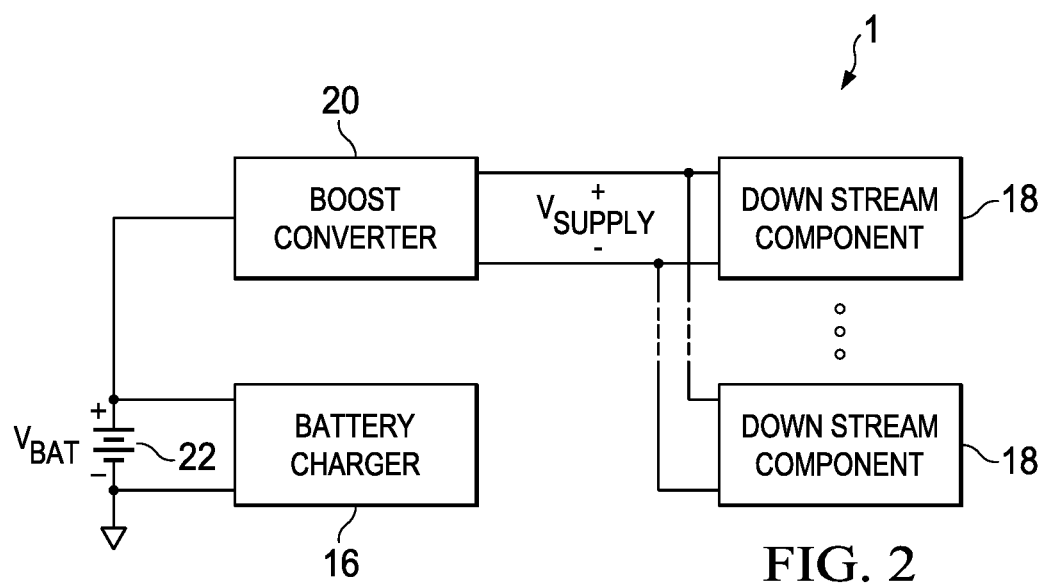
FIG. 2 illustrates a block diagram of selected components internal to a mobile device, in accordance with embodiments of the present disclosure.

FIG. 2 illustrates a block diagram of selected components integral to mobile device 1, in accordance with embodiments of the present disclosure. As shown in FIG. 2, mobile device 1 may include a boost converter 20 configured to boost a battery voltage $V_{BAT}$ to generate a supply voltage $V_{SUPPLY}$ to a plurality of downstream components 18 of mobile device 1. Downstream components 18 of mobile device 1 may include any suitable functional circuits or devices of mobile device 1, including without limitation processors, audio coder/decoders, amplifiers, display devices, etc. As shown in FIG. 2, mobile device 1 may also include a battery charger 16 for recharging battery 22.

In some embodiments of mobile device 1, boost converter 20 and battery charger 16 may comprise the only components of mobile device 1 electrically coupled to battery 22, and boost converter 20 may electrically interface between battery 22 and all downstream components 18 of mobile device 1. However, in other embodiments of mobile device 1, some downstream components 18 may electrically couple directly to battery 22.

Figure 3A:
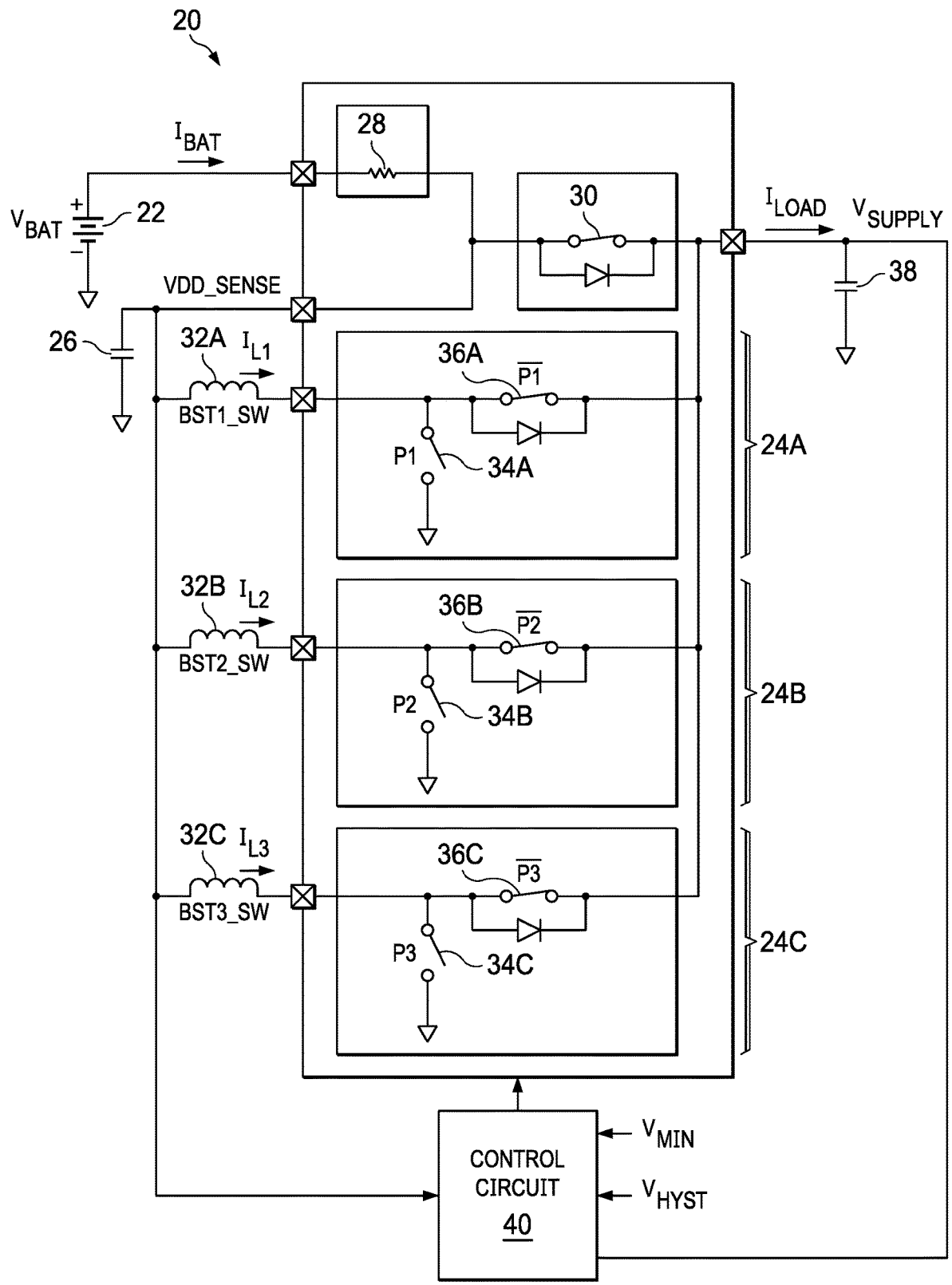
FIG. 3A illustrates a block diagram of selected components of an example boost converter with multiple modes of operation depicting operation in a bypass mode, in accordance with embodiments of the present disclosure.

FIG. 3A illustrates a block diagram of selected components of an example boost converter 20 with multiple modes of operation depicting operation in a bypass mode, in accordance with embodiments of the present disclosure. As shown in FIG. 3A, boost converter 20 may include a battery 22, a plurality of inductive boost phases 24, a sense capacitor 26, a sense resistor 28, a bypass switch 30, and a control circuit 40. As shown in FIG. 3A, each inductive boost phase 24 may include a power inductor 32, a charge switch 34, a rectification switch 36, and output capacitor 38.

Figure 3B:
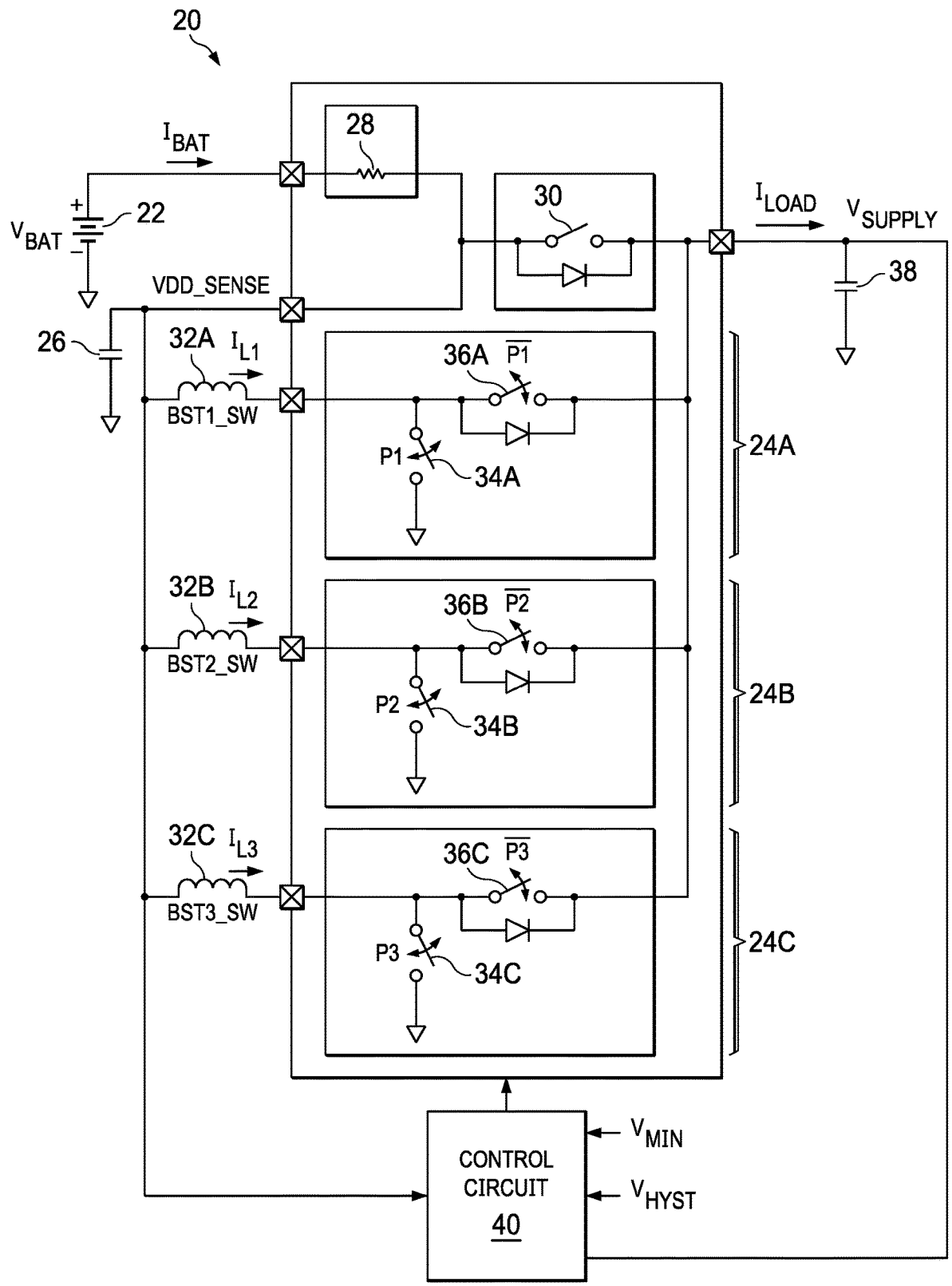
FIG. 3B illustrates a block diagram of selected components of an example boost converter with multiple modes of operation depicting operation in a boost active mode, in accordance with embodiments of the present disclosure.
Figure 3C:
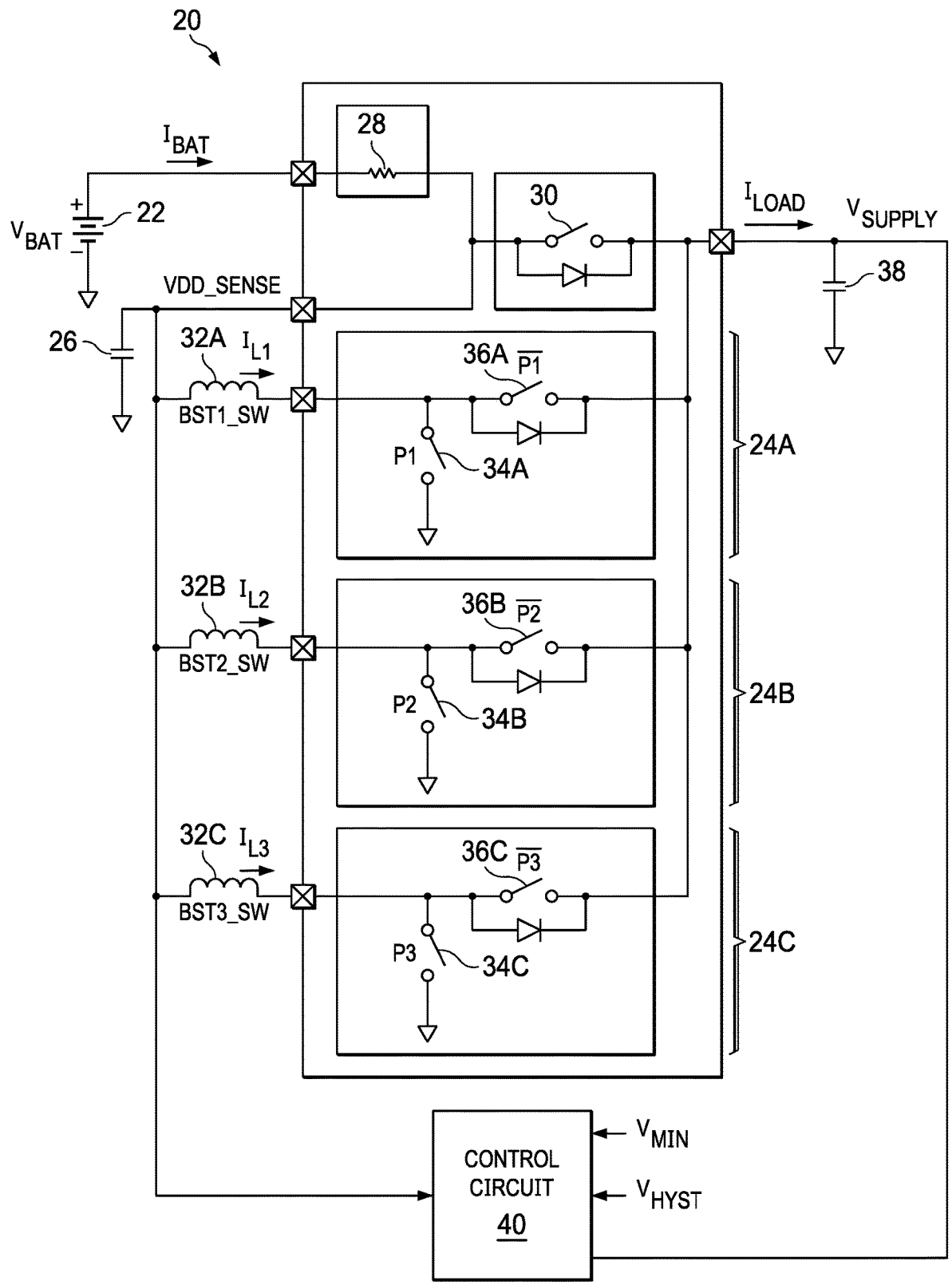
FIG. 3C illustrates a block diagram of selected components of an example boost converter with multiple modes of operation depicting operation in a boost inactive mode, in accordance with embodiments of the present disclosure.

Although FIGS. 3A-3C depict boost converter 20 having three inductive boost phases 24, embodiments of boost converter 20 may have any suitable number of inductive boost phases 24. In some embodiments, boost converter 20 may comprise three or more inductive boost phases 24. In other embodiments, boost converter 20 may comprise fewer than three phases (e.g., a single phase or two phases).

Boost converter 20 may operate in the bypass mode when supply voltage $V_{SUPPLY}$ generated by boost converter 20 is greater than a threshold minimum voltage $V_{MIN}$. In some embodiments, such threshold minimum voltage $V_{MIN}$ may be a function of a monitored current (e.g., a current through sense resistor 28). In some embodiments, such threshold minimum voltage $V_{MIN}$ may be varied in accordance with variations in the monitored current, in order to provide desired headroom from components supplied from supply voltage $V_{SUPPLY}$. Control circuit 40 may be configured to sense supply voltage $V_{SUPPLY}$ and compare supply voltage $V_{SUPPLY}$ to threshold minimum voltage $V_{MIN}$. In the event that supply voltage $V_{SUPPLY}$ and voltage VDD_SENSE across sense capacitor 26 are greater than threshold minimum voltage $V_{MIN}$, control circuit 40 may activate (e.g., enable, close, turn on) bypass switch 30 and one or more rectification switches 36 and deactivate (e.g., disable, open, turn off) charge switches 34. In such bypass mode, the resistances of rectification switches 36, power inductors 32, and bypass switch 30 may combine to minimize a total effective resistance of a path between battery 22 and supply voltage $V_{SUPPLY}$.

FIG. 3B illustrates a block diagram of selected components of example boost converter 20 depicting operation in a boost active mode, in accordance with embodiments of the present disclosure. In the boost active mode, control circuit 40 may deactivate (e.g., disable, open, turn off) bypass switch 30, and periodically commutate charge switches 34 (e.g., during a charging state of an inductive boost phase 24) and rectification switches 36 (e.g., during a transfer state of an inductive boost phase 24) of inductive boost phase 24 (as described in greater detail below) by generating appropriate control signals $P_1$, $\overline{P_1}$, $P_2$, $\overline{P_2}$, $P_3$, and $\overline{P_3}$, to deliver a current $I_{BAT}$ and boost battery voltage $V_{BAT}$ to a higher supply voltage $V_{SUPPLY}$ in order to provide a programmed (or servoed) desired current (e.g., average current) to the electrical node of supply voltage $V_{SUPPLY}$, while maintaining supply voltage $V_{SUPPLY}$ above threshold minimum voltage $V_{MIN}$. For example, control circuit 40 may operate in the boost active mode to maintain an inductor current $I_L$ (e.g., $I_{L1}$, $I_{L2}$, $I_{L3}$) between a peak current and a valley current as described in U.S. patent application Ser. No. 17/119,517 filed Dec. 11, 2020, and incorporated by reference herein in its entirety. In the boost active mode, control circuit 40 may operate boost converter 20 by operating inductive boost phase 24 in a peak and valley detect operation, as described in greater detail below. The resulting switching frequency of charge switches 34 and rectification switches 36 of inductive boost phase 24 may be determined by the sense voltage VDD_SENSE, supply voltage $V_{SUPPLY}$, an inductance of power inductor 32A, and a programmed ripple parameter (e.g., a configuration of a target current ripple for an inductor current $I_L$).

FIG. 3C illustrates a block diagram of selected components of boost converter 20 depicting operation in a boost inactive mode, in accordance with embodiments of the present disclosure. Boost converter 20 may operate in the boost inactive mode when supply voltage $V_{SUPPLY}$ generated by boost converter 20 rises above hysteresis voltage $V_{HYST}$ and a sense voltage VDD_SENSE remains below supply voltage $V_{SUPPLY}$. In the boost inactive mode, control circuit 40 may deactivate (e.g., disable, open, turn off) bypass switch 30, charge switches 34, and rectification switches 36. Thus, when sense voltage VDD_SENSE remains below supply voltage $V_{SUPPLY}$, control circuit 40 prevents boost converter 20 from entering the bypass mode in order to not backpower battery 22 from supply voltage $V_{SUPPLY}$. Further, if supply voltage $V_{SUPPLY}$ should fall below threshold minimum voltage $V_{MIN}$, control circuit 40 may cause boost converter 20 to again enter the boost active mode in order to maintain supply voltage $V_{SUPPLY}$ between threshold minimum voltage $V_{MIN}$ and hysteresis voltage $V_{HYST}$.

Figure 4:
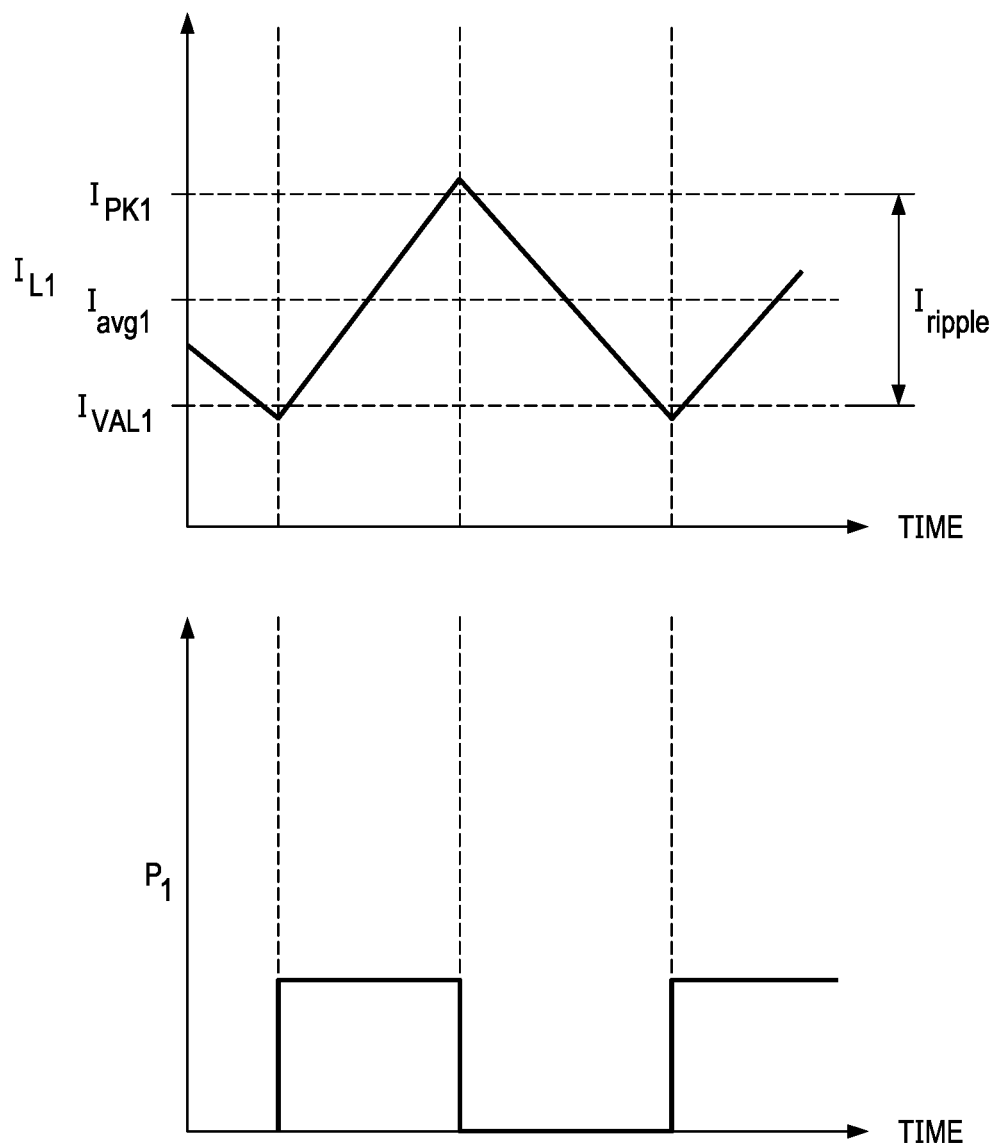
FIG. 4 illustrates a graph of inductor current through a phase of a boost converter and a control signal of switches of the phase versus time, in accordance with embodiments of the present disclosure.

As described above, when boost converter 20 operates in the boost active mode, control circuit 40 may provide hysteretic current control of inductor currents $I_{L1}$, $I_{L2}$, and $I_{L3}$ through power inductors 32A, 32B, and 32C, respectively. FIG. 4 illustrates an example graph of inductor current $I_{L1}$ and control signal $P_1$ versus time, in accordance with embodiments of the present disclosure. As shown in FIG. 4, control circuit 40 may generate control signals $P_1$ and $\overline{P_1}$ of inductive boost phase 24A such that: (a) when inductor current $I_{L1}$ falls below a valley current threshold $I_{val1}$, control circuit 40 may activate charge switch 34A and deactivate rectification switch 36A; and (b) when inductor current $I_{L1}$ increases above a peak current threshold $I_{pk1}$, control circuit 40 may deactivate charge switch 34A and activate rectification switch 36A. Accordingly, control circuit 40 may provide hysteretic control of inductor current $I_{L1}$ such that inductor current $I_{L1}$ varies between approximately valley current threshold $I_{val1}$ and approximately peak current threshold $I_{pk1}$, with inductor current $I_{L1}$ having an average current $I_{avg1}$ and a ripple current $I_{ripple}$, such that:

$$I_{pk1} = I_{avg1} + \frac{I_{ripple}}{2}; \text{ and}$$

$$I_{val1} = I_{avg1} - \frac{I_{ripple}}{2}.$$

Control circuit 40 may also generate control signals $P_2$, $\overline{P_2}$, $P_3$, and $\overline{P_3}$ of inductive boost phases 24B and 24C to provide similar or identical control of inductor currents $I_{L2}$ and $I_{L3}$.

Figure 5:
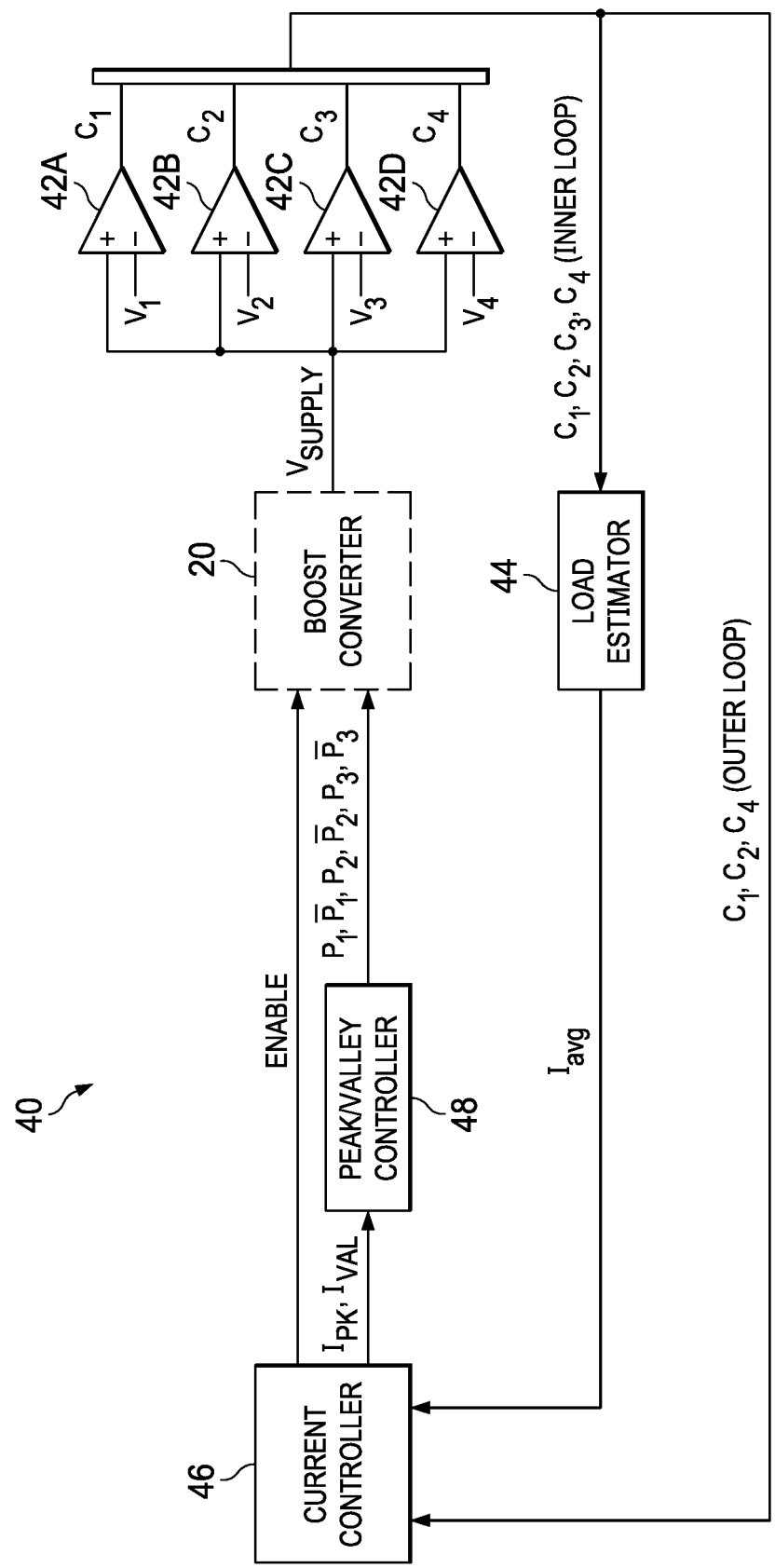
FIG. 5 illustrates a block diagram of selected components of an example control circuit for a boost converter, in accordance with embodiments of the present disclosure.

FIG. 5 illustrates a block diagram of selected components of control circuit 40, in accordance with embodiments of the present disclosure. As shown in FIG. 5, control circuit 40 may comprise a plurality of comparators 42A, 42B, 42C, and 42D, each configured to compare supply voltage $V_{SUPPLY}$ to a respective threshold voltage $V_1$, $V_2$, $V_3$, and $V_4$, and generate respective comparison signals $C_1$, $C_2$, $C_3$, and $C_4$.

Based on comparison signals $C_1$, $C_2$, $C_3$, and $C_4$, a load estimator 44 of control circuit 40 may implement an inner control loop to estimate a load seen at the output of boost converter 20, and based thereon, generate a target average current $I_{avg}$ for battery current $I_{BAT}$. The inner control loop may be said to provide continuous control of inductor current $I_L$. Further, based on comparison signals $C_1$, $C_2$, and $C_4$, and target average current $I_{avg}$, a current controller 46 of control circuit 40 may implement an outer control loop. Both the inner control loop and outer control loop may be used to set valley current threshold $I_{val}$, peak current threshold $I_{pk}$, and a control signal ENABLE for selectively enabling or disabling the boost active mode of boost converter 20. In operation, the inner control loop may maximize efficiency of boost converter 20 and minimize ripple on voltage $V_{SUPPLY}$, while the outer control loop may bound a maximum ripple of supply voltage $V_{SUPPLY}$. Based on valley current threshold $I_{val}$ and peak current threshold $I_{pk}$, a peak/valley controller 48 of control circuit 40 may generate control signals for controlling boost converter 20.

Figure 6:
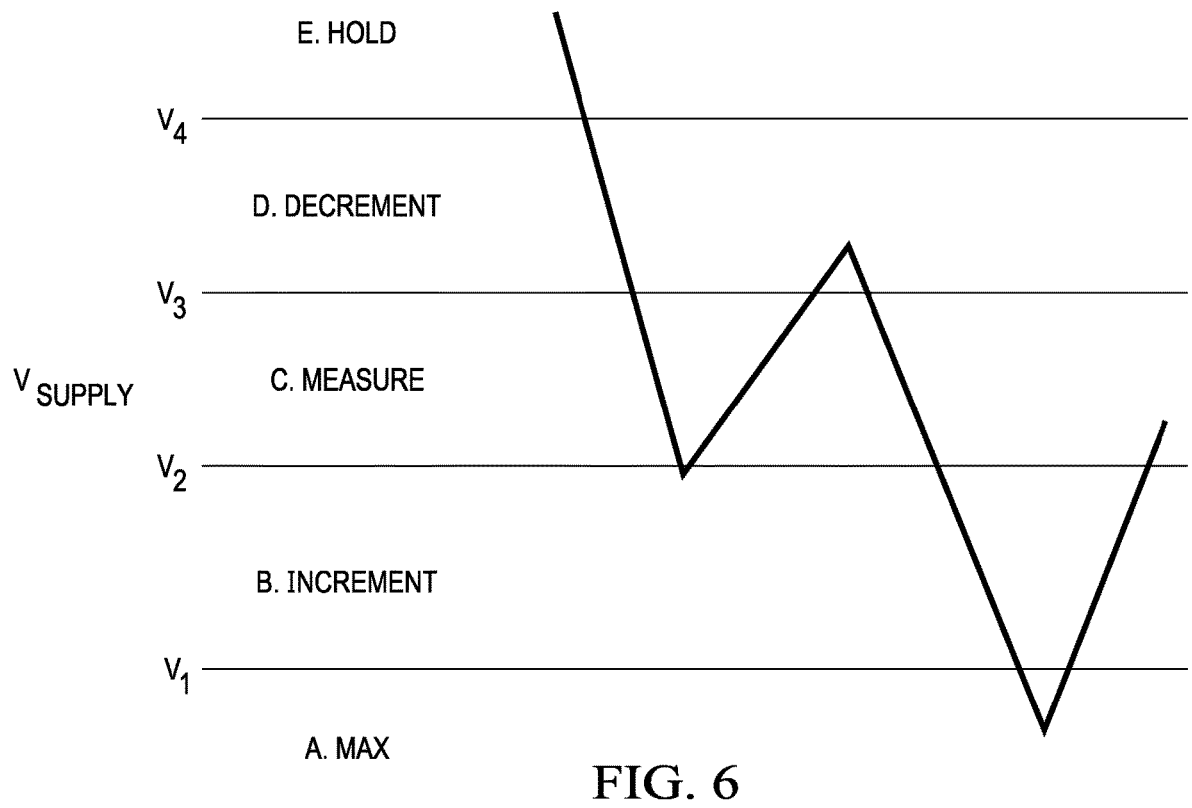
FIG. 6 illustrates an example graph of a supply voltage generated by the boost converter of FIGS. 3A-3C versus time, in accordance with the present disclosure.

FIG. 6 illustrates an example graph of supply voltage $V_{SUPPLY}$ versus time, in accordance with the present disclosure. As shown in FIG. 6, threshold voltages $V_1$, $V_2$, $V_3$, and $V_4$ may divide the magnitude of supply voltage $V_{SUPPLY}$ into five distinct regions A, B, C, D, and E. FIG. 6 demonstrates how load estimator 44 may adjust target average current $I_{avg}$ in each of these five distinct regions A, B, C, D, and E.

Region A may be referred to as the MAX region. Is this region, supply voltage $V_{SUPPLY}$ is below an undervoltage threshold represented by threshold voltage $V_1$. Accordingly, in Region A, load estimator 44 may set target average current $I_{avg}$ to its maximum in order to cause generation of as much inductor current $I_L$ (e.g., $I_{L1}$, $I_{L2}$, $I_{L3}$) as possible in order to minimize droop of supply voltage $V_{SUPPLY}$.

Region B may be referred to as the INCREMENT region. In this region between threshold voltages $V_1$ and $V_2$, load estimator 44 may recursively increment target average current $I_{avg}$ in order to increase current delivered by boost converter 20 in order to increase supply voltage $V_{SUPPLY}$. Load estimator 44 may increment target average current $I_{avg}$ using multiplicative recursion (e.g., $I_{avg(i+1)}=I_{avg(i)} \times a_1$, where $a_1>1$), additive recursion (e.g., $I_{avg(i+1)}=I_{avg(i)}+a_2$, where $a_2>0$), or any other recursive approach.

Region C may be referred to as the MEASURE region, in which $V_{SUPPLY}$ is between threshold voltages $V_2$ and $V_3$. In Region C, load estimator 44 may measure a time in which supply voltage $V_{SUPPLY}$ takes to cross threshold voltages $V_2$ and $V_3$ and may update target average current $I_{avg}$ accordingly, as described in greater detail below.

Region D may be referred to as the DECREMENT region. In this region between threshold voltages $V_3$ and $V_4$, load estimator 44 may recursively decrement target average current $I_{avg}$ in order to decrease current delivered by boost converter 20 in order to decrease supply voltage $V_{SUPPLY}$. Load estimator 44 may decrement target average current $I_{avg}$ using multiplicative recursion (e.g., $I_{avg(i+1)}=I_{avg(i)} \times a_1$, where $a_1<1$), additive recursion (e.g., $I_{avg(i+1)}=I_{avg(i)}+a_2$, where $a_2<0$), or any other recursive approach.

Region E may be referred to as the HOLD region. In this region above threshold voltage $V_4$, load estimator 44 may hold or maintain the value of decrement target average current $I_{avg}$ (e.g., $I_{avg(i+1)}=I_{avg(i)}$).

Figure 7:
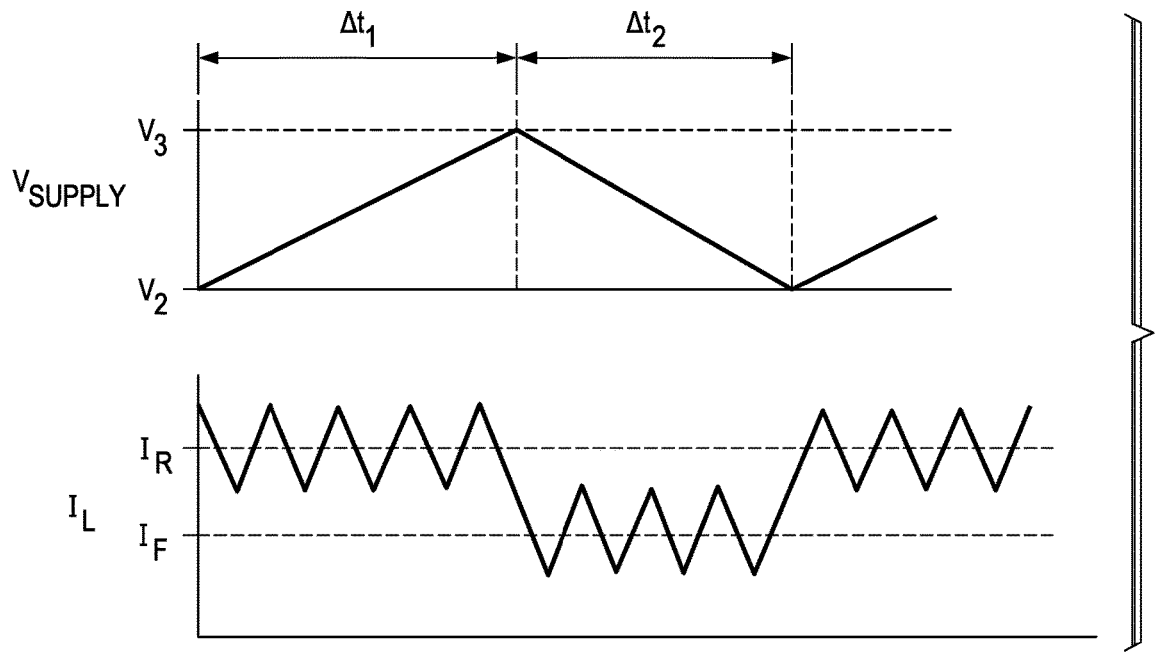
FIG. 7 illustrates a waveform of a supply voltage generated by a power converter over a period of time and a waveform of an inductor current within the power converter over the same period of time, in accordance with the present disclosure.

As discussed above, when in Region C, load estimator 44 measures the time supply voltage $V_{SUPPLY}$ takes to cross threshold voltages $V_2$ and $V_3$, and may use such measurement to update target average current $I_{avg}$. To illustrate, reference is made to FIG. 7 which depicts a waveform of supply voltage $V_{SUPPLY}$ over a period of time and a waveform of an inductor current $I_L$ (e.g., one of inductor currents $I_{L1}$, $I_{L2}$, $I_{L3}$) over the same period of time. As shown in FIG. 7, load estimator 44 may measure a time $\Delta t_1$ it takes supply voltage $V_{SUPPLY}$ to increase from threshold voltage $V_2$ to threshold voltage $V_3$. The change in voltage from threshold voltage $V_2$ to threshold voltage $V_3$ divided by the time $\Delta t_1$ may define a slope $s_1$. Similarly, load estimator 44 may measure a time $\Delta t_2$ it takes supply voltage $V_{SUPPLY}$ to decrease from threshold voltage $V_3$ to threshold voltage $V_2$. The change in voltage from threshold voltage $V_3$ to threshold voltage $V_2$ divided by the time $\Delta t_2$ may define a slope $s_2$. Average inductor current $I_{avg(i)}$ through an individual power inductor 32 during a rising supply voltage $V_{SUPPLY}$ may be defined as a rise current $I_R$, while average inductor current $I_{avg(i)}$ through an individual power inductor 32 during a falling supply voltage $V_{SUPPLY}$ may be defined as a fall current $I_F$.

Using a charge balance relationship for output capacitor 38 coupled to supply voltage $V_{SUPPLY}$, load estimator 44 may update target average current $I_{avg}$ drawn from battery 22. For example, using the measurement for rise current $I_R$, target average current $I_{avg}$ may be updated in accordance with:

$$I_{avg} = I_R - s_1 \cdot \frac{C_{out}}{D'_i}$$

Where $D'_i$ is equal to one minus the duty cycle of inductor current $I_L$ and $C_{out}$ is a capacitance of output capacitor 38. The quotient $$\frac{C_{out}}{D'_i}$$

may be unknown or uncertain, but may be estimated. For example, in some embodiments, load estimator 44 may estimate the quotient $C_{out}/D'_i$ using fixed values. However, if an input voltage (e.g., voltage VDD_SENSE) is known, the inverse of $D'_i$ may be approximately equal to the quotient of supply voltage $V_{SUPPLY}$ divided by such input voltage. Thus, the foregoing equation for updating target average current $I_{avg}$ may be written:

$$I_{avg} = I_R - s_1 \cdot \frac{V_{SUPPLY}}{VDD\_SENSE} \cdot C_{out}$$

However, such relationship may have uncertainty due to the approximation of output capacitance $C_{out}$ and the assumption that boost converter 20 is lossless. But, such uncertainty may be eliminated by using both measurements for rise current $I_R$ and fall current $I_F$, as given by the equation:

$$I_{avg} = I_F - \frac{s_2}{s_1 - s_2} \cdot (I_R - I_F)$$

If it is assumed that the increase in voltage from threshold voltage $V_2$ to threshold voltage $V_3$ is equal in magnitude to the decrease in voltage from threshold voltage $V_3$ to threshold voltage $V_2$, then the foregoing equation for updating target average current $I_{avg}$ may be written:

$$I_{avg} = \left(\frac{I_R}{\frac{\Delta t_2}{\Delta t_1}+1}\right) + \left(1 - \frac{1}{\frac{\Delta t_2}{\Delta t_1}+1}\right) I_F$$

The two approaches above for updating target average current $I_{avg}$ may each have their own advantages and disadvantages. For example, the update based on one current measurement may be better at detecting large, fast transients, but could be inaccurate due to assumptions regarding the duty cycle and output capacitance $C_{out}$, and also assumes that changes in voltage and measurements of current are known exactly. The update based on two current measurements may be more robust against offsets in the changes in voltage and measurements of current, but such approach assumes the load of boost converter 20 is fixed over both measurements, which may not be the case, especially in the presence of large transients. Thus, in some embodiments, a hybrid approach may be used in which the single-measurement approach is used if only one measurement is available or if the single measurement is larger (or smaller) than the dual measurement by more than the band of uncertainty of the single-measurement approach, and the dual-measurement approach is used otherwise.

Figure 8:
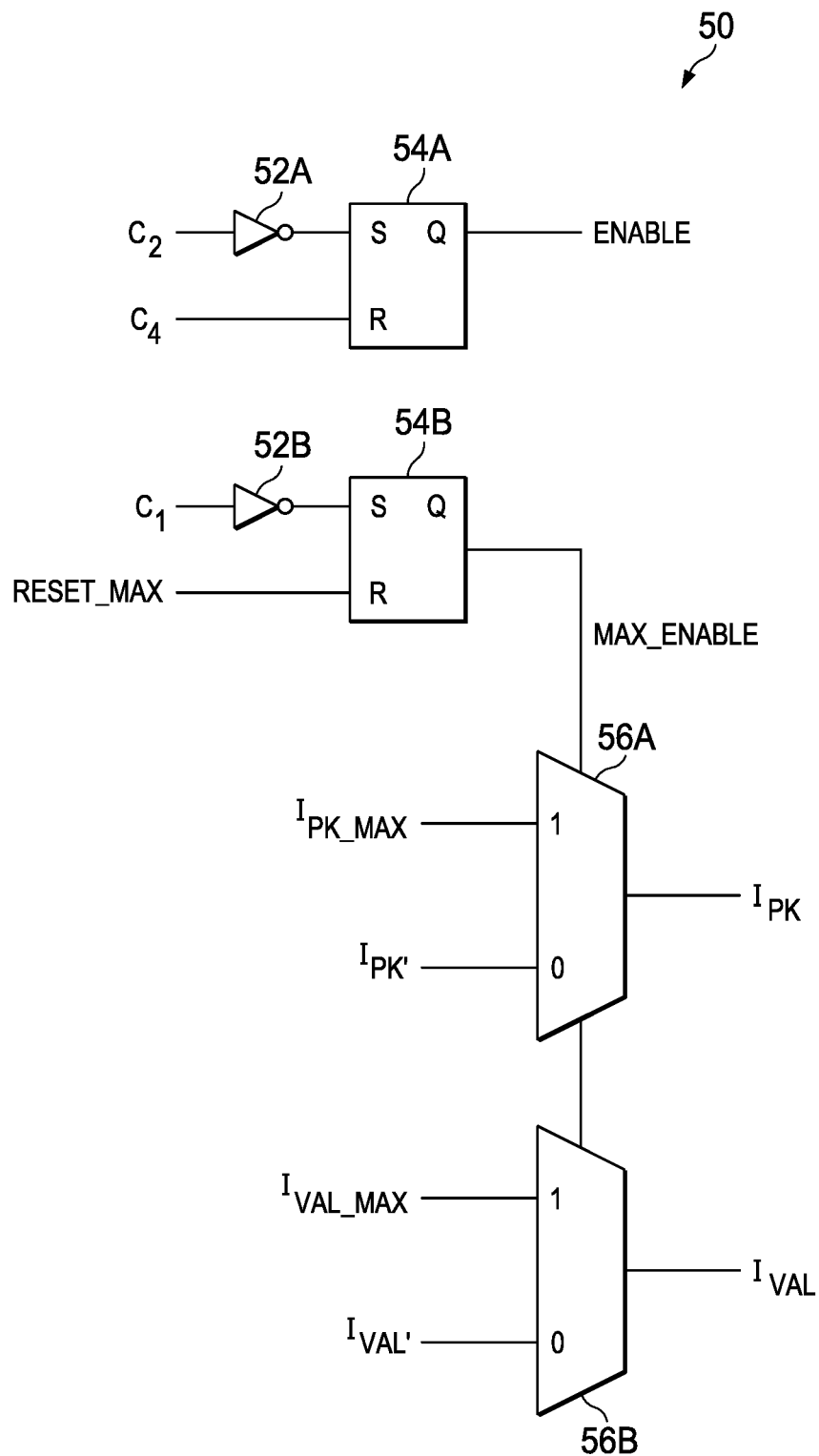
FIG. 8 illustrates a block diagram of selected components of an outer control loop subsystem of the current controller shown in FIG. 5, in accordance with embodiments of the present disclosure.

FIG. 8 illustrates a block diagram of selected components of an outer loop control subsystem 50 of current controller 46, in accordance with embodiments of the present disclosure. As shown in FIG. 8, current controller 46 may be implemented using logic inverters 52A and 52B, set-reset latches 54A and 54B, and multiplexers 56A and 56B.

Logic inverter 52A may invert comparison signal $C_2$ and set-reset latch 54A may hysteretically generate control signal ENABLE such that control signal ENABLE is asserted when supply voltage $V_{SUPPLY}$ falls below threshold voltage $V_2$ and is deasserted when supply voltage $V_{SUPPLY}$ rises above threshold voltage $V_4$. When control signal ENABLE is deasserted, control circuit 40 may disable charge switches 34 and rectification switches 36 and boost converter 20 may be operated in the boost inactive mode.

Further, inverter 52B may invert comparison signal $C_1$ and set-reset latch MB may hysteretically generate control signal MAX_ENABLE that indicates whether a maximum for target average current $I_{avg}$ should be generated by control circuit 40. Receipt of control signal RESET_MAX may deassert control signal MAX_ENABLE, to return control of peak current threshold $I_{pk}$ and valley current threshold $I_{val}$ to the inner control loop. Multiplexer 56A may, based on control signal MAX_ENABLE, a maximum for peak current threshold $I_{pk}$ and a target peak current threshold $I_{pk}$ (e.g., derived from target average current $I_{avg}$ calculated by load estimator 44), generate a peak current threshold $I_{pk}$. Similarly, multiplexer 56B may, based on control signal MAX_ENABLE, a maximum for valley current threshold $I_{val}$, and a target valley current threshold $I_{val}$ (e.g., derived from target average current $I_{avg}$ calculated by load estimator 44), generate a valley current threshold $I_{val}$.

Figure 9:
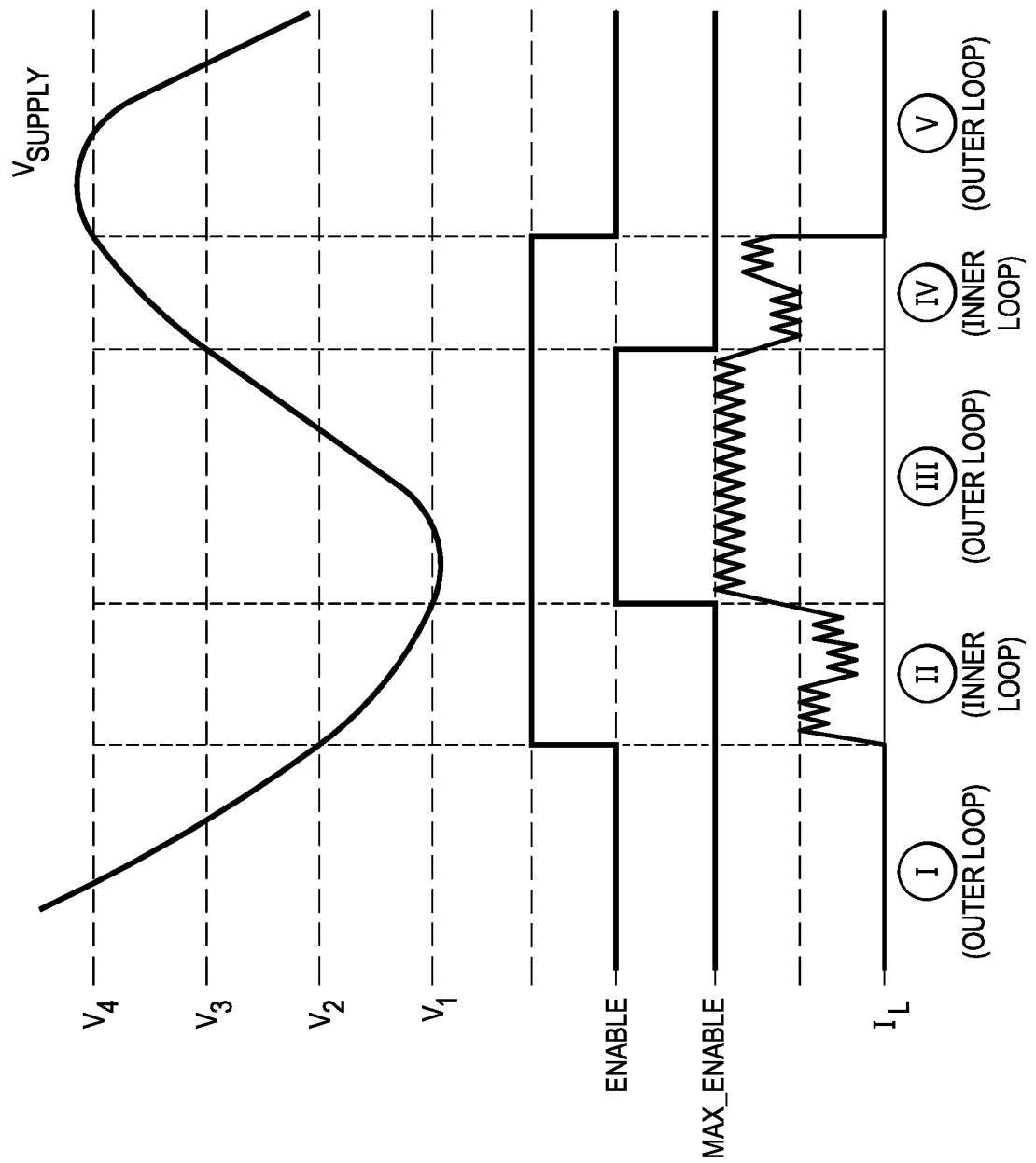
FIG. 9 illustrates example waveforms depicting an example of outer loop control for a boost converter, in accordance with embodiments of the present disclosure.

To further illustrate outer loop control by current controller 46, reference is made to FIG. 9. As shown in FIG. 9, in Region I of the waveforms, supply voltage $V_{SUPPLY}$ exceeds threshold voltage $V_4$, and boost converter 20 may be placed in the boost inactive mode as set-reset latch MA may cause control signal ENABLE to be deasserted, leaving boost converter 20 with a high-impedance. Accordingly, in Region I, the load of boost converter 20 may cause a decrease in supply voltage $V_{SUPPLY}$.

When supply voltage $V_{SUPPLY}$ decreases below threshold voltage $V_2$, set-reset latch 54A may cause control signal ENABLE to be asserted, and boost converter 20 may enter the boost active mode. In Region II of the waveforms shown in FIG. 9, load estimator 44 may in effect control peak current threshold $I_{pk}$ and valley current threshold $I_{val}$, through the estimate of target average current $I_{avg}$ performed by load estimator 44. However, in the specific example shown in FIG. 9, load estimator 44 may not "turn around" supply voltage $V_{SUPPLY}$ quick enough, and supply voltage $V_{SUPPLY}$ may continue to decrease.

Accordingly, supply voltage $V_{SUPPLY}$ may decrease below threshold voltage $V_1$, thus causing set-reset latch 54B to set, asserting control signal MAX_ENABLE, forcing peak current $I_{pk}$ and target valley current $I_{val}$ to their maximum values (maximum peak current $I_{pk\text{-}max}$ and maximum valley current $I_{avg\text{-}max}$) in Region III of FIG. 9. After sufficient increase in supply voltage $V_{SUPPLY}$, set-reset latch 54B may reset and deassert control signal MAX_ENABLE, and load estimator 44 may again regain control as shown in Region IV of the waveforms. If supply voltage $V_{SUPPLY}$ increases further again in excess of threshold voltage $V_4$, set-reset latch 54A may again deassert control signal ENABLE, causing boost converter 20 to enter the boost inactive mode.

Accordingly, the outer loop implemented by current controller 46 may toggle boost converter 20 between a maximum current and high-impedance state, and bound a ripple in supply voltage $V_{SUPPLY}$ to approximately between threshold voltages $V_1$ and $V_4$ even when inner loop control of load estimator 44 fails to regulate supply voltage $V_{SUPPLY}$.

Figure 10:
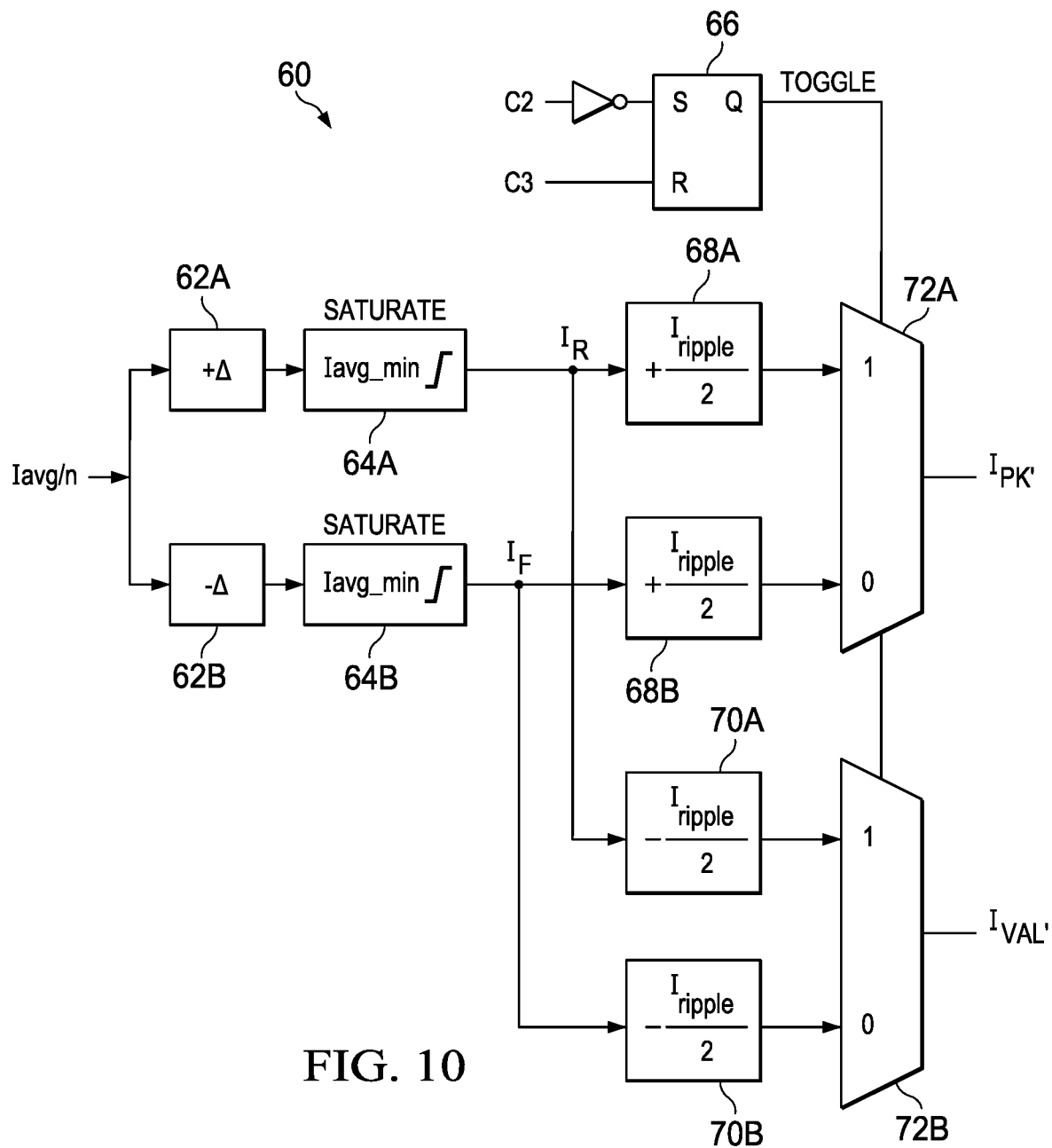
FIG. 10 illustrates a block diagram of selected components of an inner control loop subsystem of the current controller shown in FIG. 5, in accordance with embodiments of the present disclosure.
Figure 11:
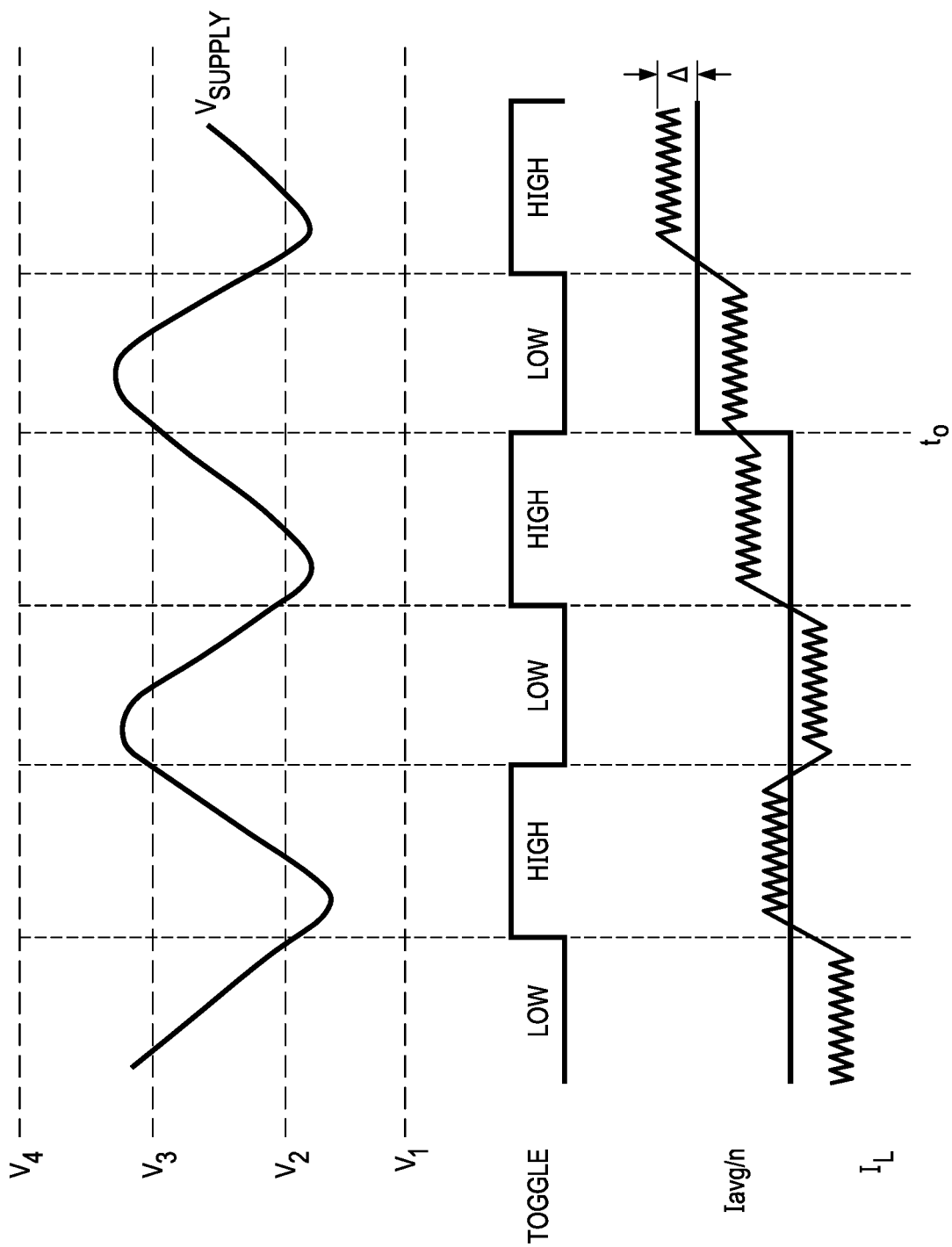
FIG. 11 illustrates example waveforms depicting an example of inner loop control for a boost converter, in accordance with embodiments of the present disclosure.

FIG. 10 illustrates a block diagram of selected components of an inner control loop subsystem 60 of current controller 46, in accordance with embodiments of the present disclosure. FIG. 11 illustrates example waveforms depicting examples of inner loop control for boost converter 20, in accordance with embodiments of the present disclosure.

As shown in FIG. 10, inner control loop subsystem 60 may receive target average current $I_{avg}$ calculated by load estimator 44, divide such target average current $I_{avg}$ by a number n of inductive boost phase 24 present in boost converter 20, and apply each of a positive offset $+\Delta$ and a negative offset $-\Delta$ to target average current $I_{avg}/n$ by offset blocks 62A and 62B, respectively. The results of offset blocks 62A and 62B may be respectively saturated to a minimum value by saturation blocks 64A and 64B to generate rise current $I_R$ and fall current $I_F$, respectively. Adder blocks 68A and 68B may add one-half of ripple current $I_{ripple}$ to each of rise current $I_R$ and fall current $I_F$ and adder blocks 70A and 70B may subtract one-half of ripple current $I_{ripple}$ from each of rise current $I_R$ and fall current $I_F$. Based on comparison signals $C_2$ and $C_3$, latch 66 may selectively assert and deassert control signal TOGGLE to toggle selection of multiplexers 72A and 72B to:

In the event control signal TOGGLE is asserted due to supply voltage $V_{SUPPLY}$ decreasing below threshold voltage $V_2$, generate an intermediate peak current threshold $I_{pk}'$ and an intermediate valley current threshold $I_{val}'$ such that $I_{pk}'=I_R+I_{ripple}/2$ and $I_{val}'=I_R-I_{ripple}/2$, and the mean inductor current is rise current $I_R$.

In the event control signal TOGGLE is deasserted due to supply voltage $V_{SUPPLY}$ increasing above threshold voltage $V_3$, generate intermediate peak current threshold $I_{pk}'$ and intermediate valley current threshold $I_{val}'$ such that $I_{pk}'=I_F+I_{ripple}/2$ and $I_{val}'=I_F-I_{ripple}/2$, and the mean inductor current is fall current $I_F$.

As shown in FIG. 8 above, intermediate peak current threshold $I_{pk}'$ and intermediate valley current threshold $I_{val}'$ may be used by outer loop control subsystem 50 to generate peak current threshold $I_{pk}$ and valley current threshold $I_{val}$.

Thus, toggling of control signal TOGGLE may maintain regulation of $V_{SUPPLY}$ between threshold voltage $V_2$ and threshold voltage $V_3$, as shown in FIG. 11. For example, when control signal TOGGLE is high, the average per phase current may be set to rise current $I_R$. Because this value of current is offset from target average current $I_{avg}$ by positive offset $+\Delta$, it may cause supply voltage $V_{SUPPLY}$ to rise. On the other hand, when control signal TOGGLE is low, the average per phase current may be set to fall current $I_F$. Because this value of current is offset from target average current $I_{avg}$ by negative offset $-\Delta$, it may cause supply voltage $V_{SUPPLY}$ to fall.

Occasionally, a change in loading at the output of boost converter 20 may lead to a change in target average current $I_{avg}$, as shown at time to in FIG. 11, in which case load estimator 44 may modify target average current $I_{avg}$ as described above.

Figure 12:
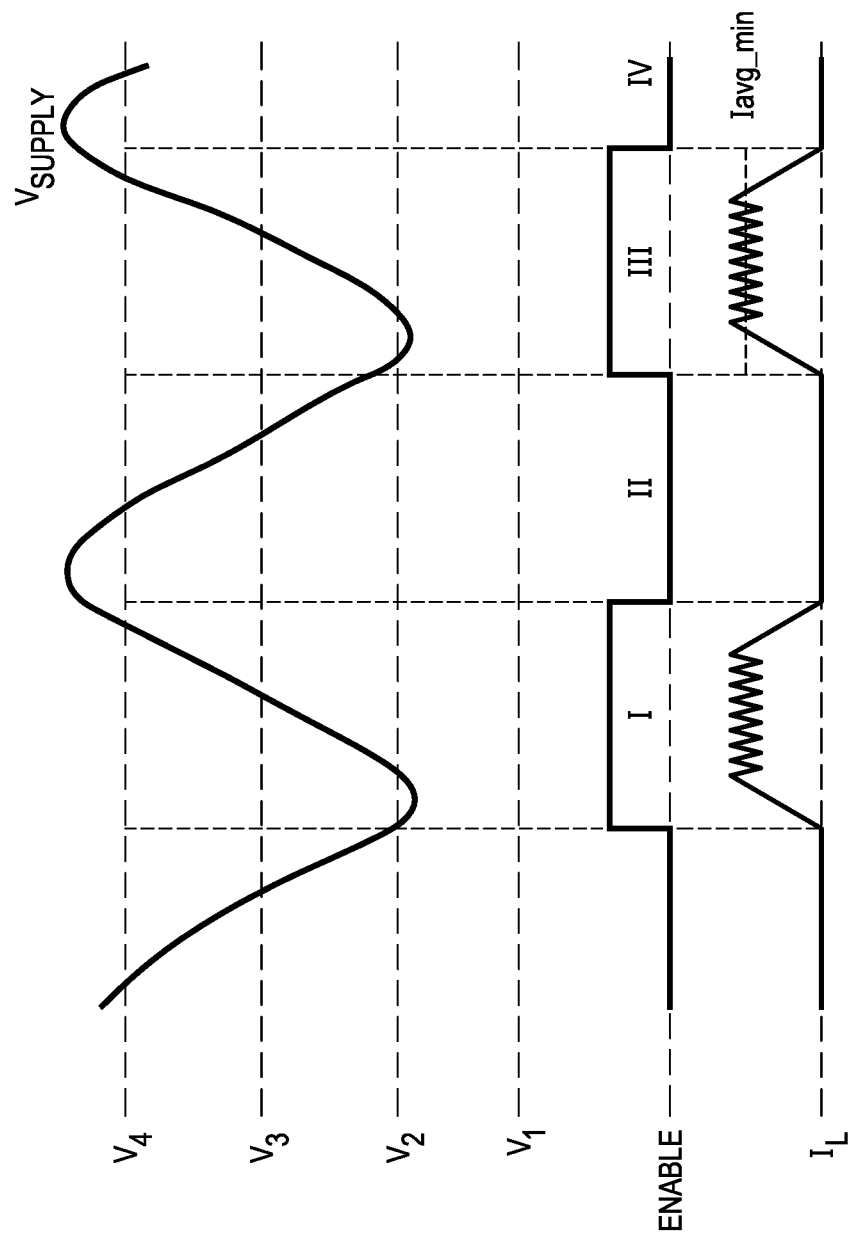
FIG. 12 illustrates example waveforms depicting an example of inner loop control for a boost converter in light-load scenarios, in accordance with embodiments of the present disclosure.

FIG. 12 illustrates example waveforms depicting examples of inner loop control for boost converter 20 in light-load scenarios, in accordance with embodiments of the present disclosure. For light-loads, target average current $I_{avg}$ calculated by load estimator 44 may be larger than a minimum target average current $I_{avg\_min}$ applied by saturations blocks 64A and 64B. Because rise current $I_R$ and fall current $I_F$ may be saturated in this scenario, inductor current $I_L$ may be larger than is required for steady-state operation of boost converter 20, forcing supply voltage $V_{SUPPLY}$ to have a positive slope in Regions I and III of FIG. 12. When supply voltage $V_{SUPPLY}$ crosses above threshold voltage $V_4$, set-reset latch 54A from outer loop control subsystem 50 may cause boost converter 20 to enter the boost inactive region, thus leading to forcing supply voltage $V_{SUPPLY}$ to have a negative slope in Regions II and IV of FIG. 12 due to the high-impedance state of boost converter 20. In light-load conditions, toggling between the boost active state and the boost inactive state with fixed saturation thresholds for peak current threshold $I_{pk}$ and valley current threshold $I_{val}$ may maximize power efficiency.

In a simple implementation of control circuit 40, control circuit 40 may be implemented as a digital control system that sets control parameters for peak current threshold $I_{pk}$, valley current threshold $I_{val}$, control signal ENABLE, and the number n of inductive boost phases 24 enabled. However, due to sample-and-hold circuitry that may be employed in such digital implementation and incumbent processing delays, several clock cycles of delay may occur between when comparators 42 toggle and when new control parameters are determined. Such delay may contribute to overshoot and undershoot in supply voltage $V_{SUPPLY}$ generated by boost converter 20, which may lead to undesirable ripple and excessive voltage droop on supply voltage $V_{SUPPLY}$. It may be desirable to have a faster response to quick load transients on supply voltage $V_{SUPPLY}$ compared to that which could be supported by a fully digital implementation of control circuit 40.

Figure 13:
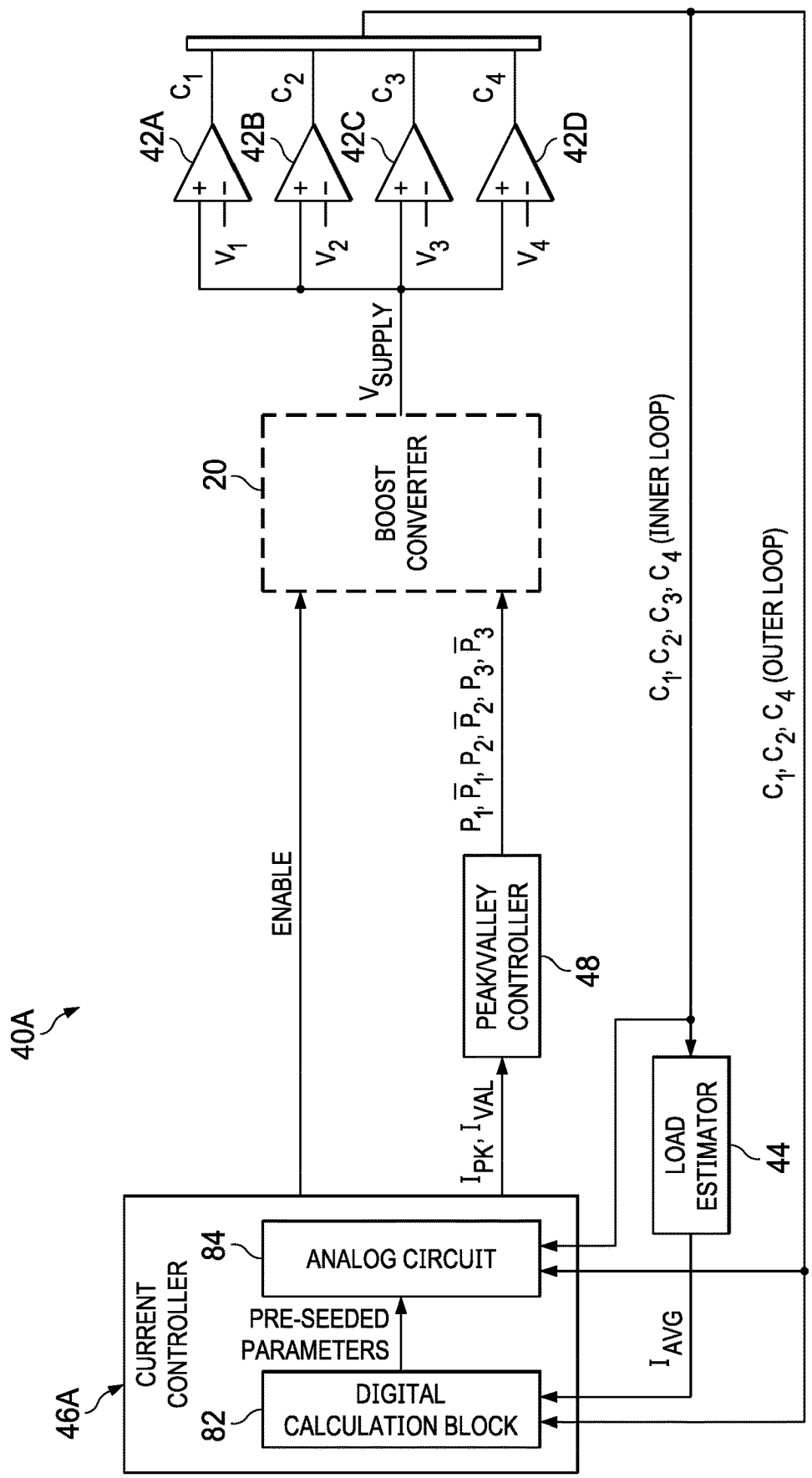
FIG. 13 illustrates a block diagram of selected components of another example control circuit for a boost converter, in accordance with embodiments of the present disclosure.

FIG. 13 illustrates a block diagram of selected components of control circuit 40A, in accordance with embodiments of the present disclosure. Control circuit 40A may be functionally and/or structurally similar in many respects to control circuit 40 shown in FIG. 5, with a main difference being that current controller 46A is split into a digital calculation block 82 and an analog circuit 84. As described in greater detail below, analog circuit 84 may minimize delays that would be present in a fully-digital implementation by using pre-seeded values for control parameters generated by digital calculation block 82 and selecting among such pre-seeded values by analog circuit 84 in order to generate control parameters communicated to peak/valley controller 48 and boost converter 20. Analog circuit 84 may be driven directly by comparators 42, such that when comparators 42 toggle, analog circuit 84 immediately changes state and chooses generated new control parameters for peak current threshold $I_{pk}$, valley current threshold $I_{val}$, control signal ENABLE, and the number n of inductive boost phases 24 enabled. Such manner of changing states and updating control parameters may create a low-latency path from comparators 42 to new, updated control parameters. On the other hand, digital calculation block 82 may be configured to calculate the pre-seeded parameters based on the outputs of comparators 42 and its internal control algorithm.

Figure 14:
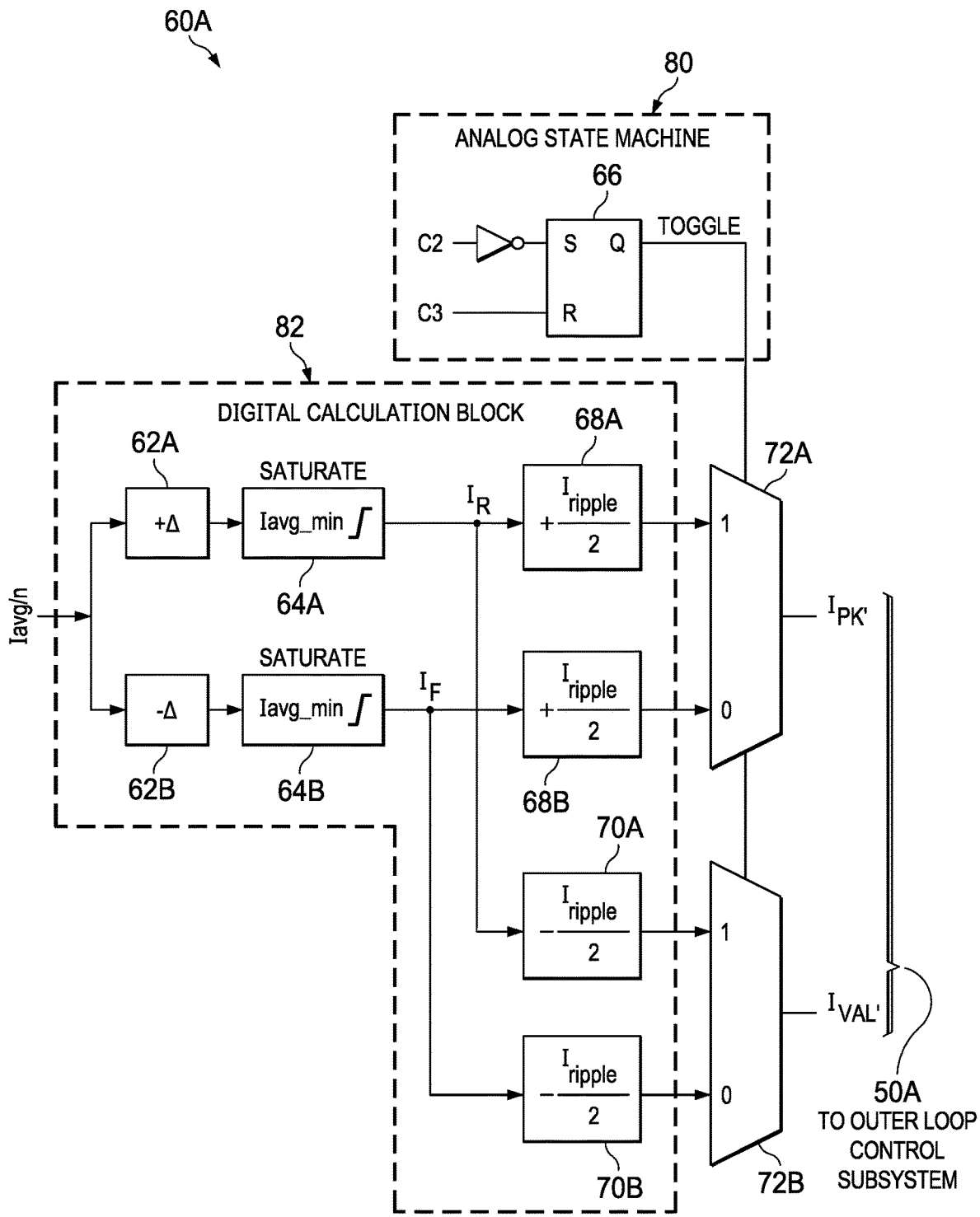
FIG. 14 illustrates a block diagram of selected components of an inner control loop subsystem of the current controller shown in FIG. 13, in accordance with embodiments of the present disclosure.

FIG. 14 illustrates a block diagram of selected components of an inner control loop subsystem 60A of current controller 46A, in accordance with embodiments of the present disclosure. Inner control loop subsystem 60A may be functionally and/or structurally similar in many respects to inner loop control subsystem 60 shown in FIG. 10, except that multiplexers 72A and 72B and a portion of analog state machine 80 may be implemented by analog circuit 84, and other components of inner loop control subsystem 60A may be implemented by digital calculation block 82. As shown in FIG. 14, digital calculation block 82 may generate pre-seeded values based on all comparison signals $C_1$, $C_2$, $C_3$, and $C_4$, and analog state machine 80 may be configured to, based on comparison signals $C_2$ and $C_3$, control selection of such pre-seeded values with multiplexers 72A and 72B in order to generate intermediate peak current threshold $I_{pk}'$ and intermediate valley current threshold $I_{val}'$.

Figure 15:
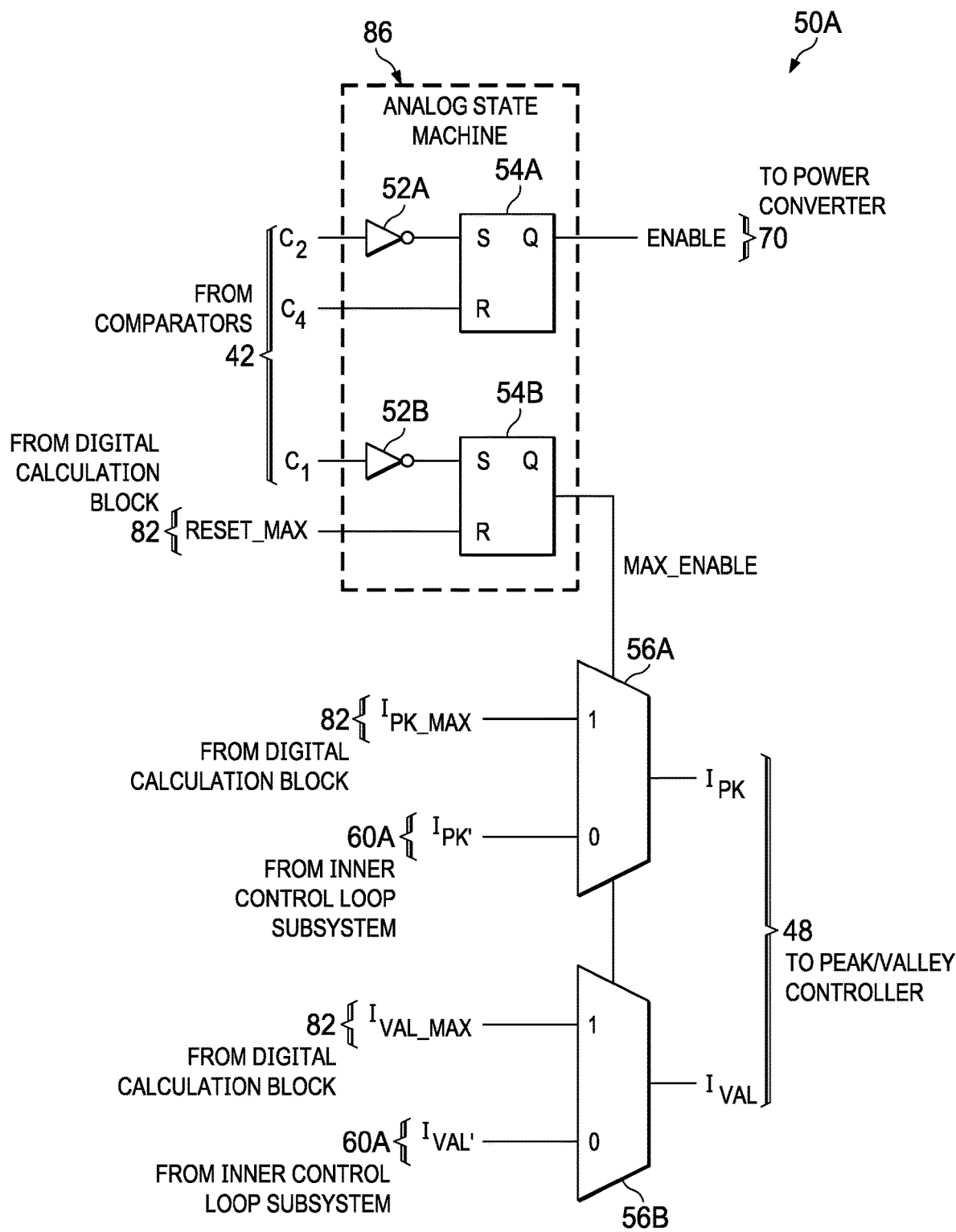
FIG. 15 illustrates a block diagram of selected components of an outer control loop subsystem of the current controller shown in FIG. 13, in accordance with embodiments of the present disclosure.

FIG. 15 illustrates a block diagram of selected components of an outer loop control subsystem 50A of current controller 46A, in accordance with embodiments of the present disclosure. Outer loop control subsystem 50A may be functionally and/or structurally similar in many respects to outer loop control subsystem 50 shown in FIG. 8, except that multiplexers 56A and 56B and a portion of analog state machine 86 may be implemented by analog circuit 84. As shown in FIG. 15, analog state machine 86 may be configured to, based on comparison signal $C_1$ and a control signal RESET_MAX generated by digital calculation block 82, control between selection of pre-seeded values for maximum peak current threshold $I_{pk\_max}$ and maximum valley current threshold $I_{val\_max}$ on the one hand and intermediate peak current threshold $I_{pk}'$ and intermediate valley current threshold $I_{val}'$ generated by inner control loop subsystem 60A on the other hand. Further, analog state machine 86 may be configured to, based on comparison signals $C_2$ and $C_4$, control signal ENABLE for boost converter 20.

In a boost converter 20 having multiple inductive boost phases 24, all inductive boost phases 24 may use identical set points for peak current threshold $I_{pk}$ and valley current threshold $I_{val}$, and a lookup table or other suitable approach may be used to determine how many inductive boost phases 24 are active based on target average current $I_{avg}$. Further, such lookup table or other suitable approach may have hysteresis to prevent excessive enabling and disabling of an individual inductive boost phase 24. In addition, the lookup table or another lookup table may be used to determine how many inductive boost phases 24 are to be enabled in a maximum current state of boost converter 20 (e.g., supply voltage $V_{SUPPLY}$<threshold voltage $V_1$).

Although the foregoing discussion contemplates current control and voltage regulation of a boost converter 20, it is understood that similar or identical approaches may be applied to other types of inductor-based power converters, including without limitation buck converters and buck-boost converters.

Referring back to FIGS. 3A-3C, each power inductor 32 of respective inductive boost phases 24 may draw a respective inductor current $I_L$ (e.g., $I_{L1}$, $I_{L2}$, and $I_{L3}$). Also, because all inductive boost phases 24 may use identical set points for peak current threshold $I_{pk}$ and valley current threshold $I_{val}$ as described above, inductor currents $I_{L1}$, $I_{L2}$, and $I_{L3}$ would all be expected to be in phase with one another in the event that impedances of each inductive boost phase 24 were identical. However, in practical implementation, if impedances of each inductive boost phase 24 are different but close in value, the respective inductor currents $I_{L1}$, $I_{L2}$, and $I_{L3}$ may slowly drift in and out of phase with one another. But relatively long periods may exist when two or more of respective inductor currents $I_{L1}$, $I_{L2}$, and $I_{L3}$ are in phase with one another.

Figure 16:
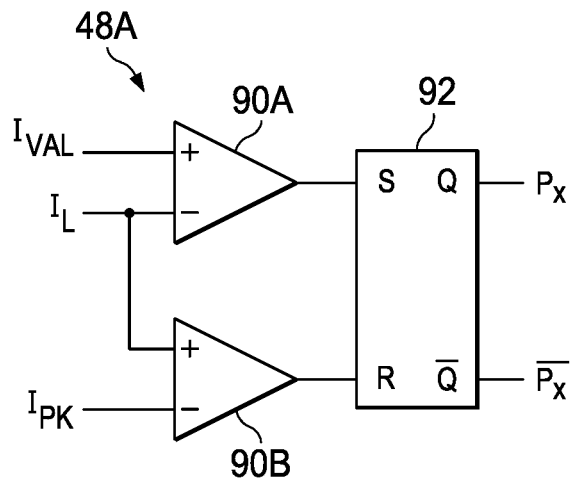
FIG. 16 illustrates a block diagram of selected components of an example peak/valley controller, in accordance with embodiments of the present disclosure.

FIG. 16 illustrates a block diagram of selected components of a peak/valley controller 48A, in accordance with embodiments of the present disclosure. In some embodiments, peak/valley controller 48A may be used to implement peak/valley controller 48 shown in FIG. 5. As shown in FIG. 16, peak/valley controller 48A may include comparators 90A and 90B and latch 92. Comparator 90A may be configured to compare an inductor current $I_L$ to valley current threshold $I_{val}$, while comparator 90B may be configured to compare an inductor current $I_L$ to peak current threshold $I_{pk}$. Latch 92 (which may be implemented as a set-reset latch or other suitable circuit or logic device) may generate control signals $P_x$ (e.g., control signals $P_1$, $P_2$, $P_3$, etc.) and $\overline{P_x}$ (e.g., control signals $\overline{P_1}$, $\overline{P_2}$, $\overline{P_3}$, etc.) for controlling switches of boost converter 20 as shown in FIG. 5. For example, when inductor current $I_L$ falls below valley current threshold $I_{val}$, latch 92 may assert control signal $P_x$ and deassert control signal $\overline{P_x}$, and when inductor current $I_L$ falls below valley current threshold $I_{val}$, latch 92 may deassert control signal $P_x$ and assert control signal $\overline{P_x}$.

Figure 17A:
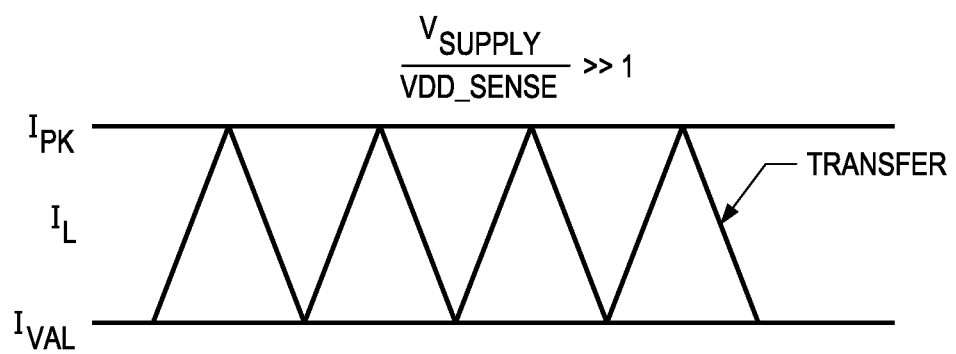
FIG. 17A illustrates a graph of an example waveform for boost converter inductor current for typical duty cycles of a boost converter, in accordance with embodiments of the present disclosure.
Figure 17B:
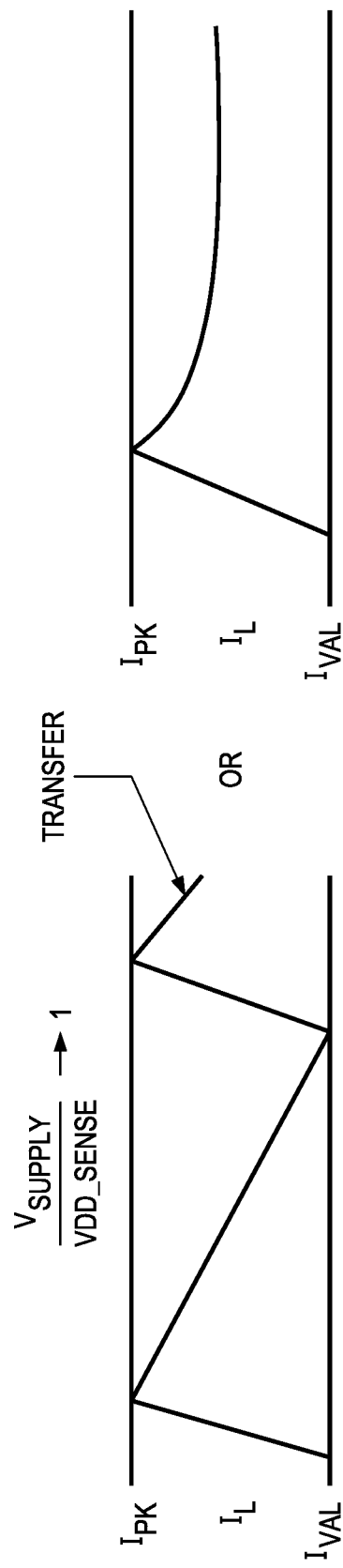
FIG. 17B illustrates graphs of example waveforms for boost converter inductor current for very low duty cycles of a boost converter, in accordance with embodiments of the present disclosure.

While the foregoing hysteretic boost converter 20 described and illustrated above may be effective in overcoming the disadvantages of many existing approaches to power converters, the systems and methods described above may have shortcomings for very low duty cycles of boost converter 20. To demonstrate these potential shortcomings, FIG. 17A illustrates a graph of an example waveform for boost converter inductor current $I_L$ for typical duty cycles of boost converter 20 (e.g., when the ratio of supply voltage $V_{SUPPLY}$ to voltage VDD_SENSE is significantly greater than 1), in accordance with embodiments of the present disclosure, while FIG. 17B illustrates graphs of example waveforms for boost converter inductor current $I_L$ for very low duty cycles of boost converter 20 (e.g., when the ratio of supply voltage $V_{SUPPLY}$ to voltage VDD_SENSE approaches 1), in accordance with embodiments of the present disclosure. As is shown in FIGS. 17A and 17B, during a transfer state of boost converter 20, a negative slope (with respect to time) of inductor current $I_L$ may be determined by the difference between supply voltage $V_{SUPPLY}$ and voltage VDD_SENSE, and as the ratio of supply voltage $V_{SUPPLY}$ to voltage VDD_SENSE approaches 1, the negative slope becomes increasingly shallow (e.g., smaller in magnitude). This decreasing-magnitude slope occurs as a result of a duty cycle of boost converter 20 becoming smaller (e.g., duty cycles of control signals $P_x$ becoming smaller), as boost converter 20 spends decreasing amounts of time in the charging state and increasing amounts of time in the transfer state as the ratio of supply voltage $V_{SUPPLY}$ to voltage VDD_SENSE approaches 1. As a result, it is possible that for some values of voltage VDD_SENSE, inductor current $I_L$ may never decrease to the valley current threshold $I_{val}$, resulting in a potentially infinite transfer state, which may further lead to inductor current $I_L$ reaching a steady-state value between peak current threshold $I_{pk}$ and valley current threshold $I_{val}$.

Figure 18A:
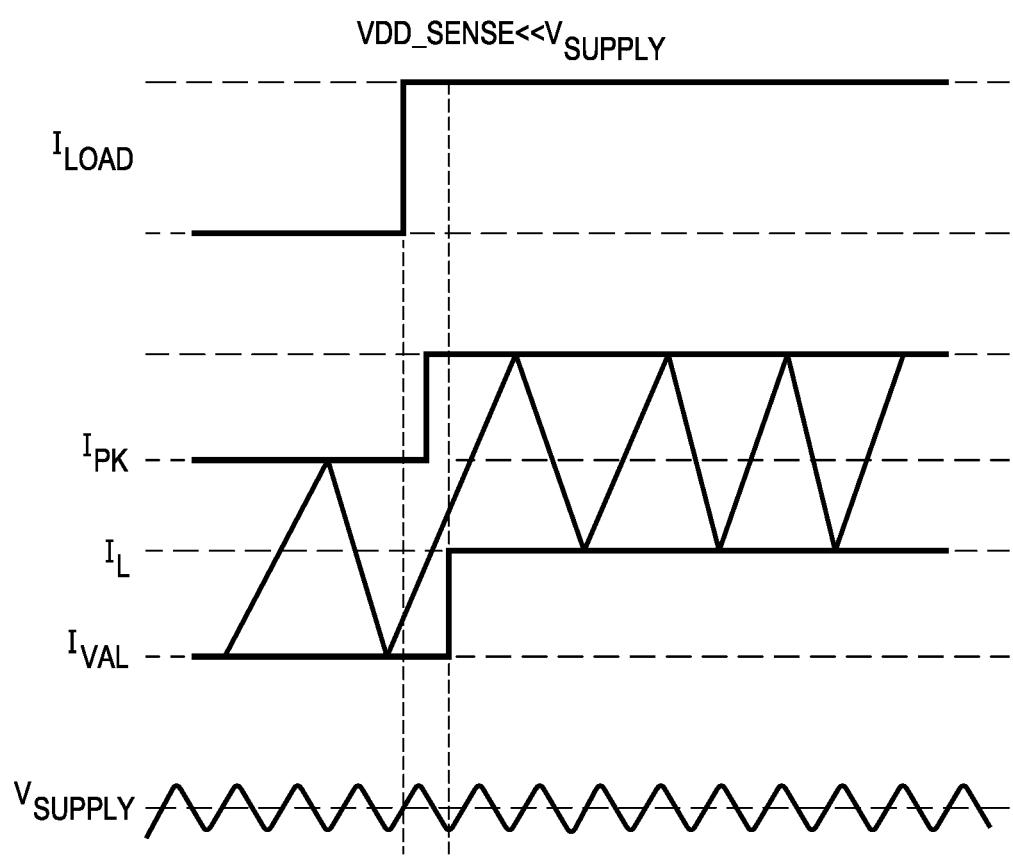
FIG. 18A illustrates graphs of example waveforms for an output current of a boost converter, boost converter inductor current, and an output voltage of the boost converter for typical duty cycles of a boost converter in response to a step in output current of the boost converter, in accordance with embodiments of the present disclosure.
Figure 18B:
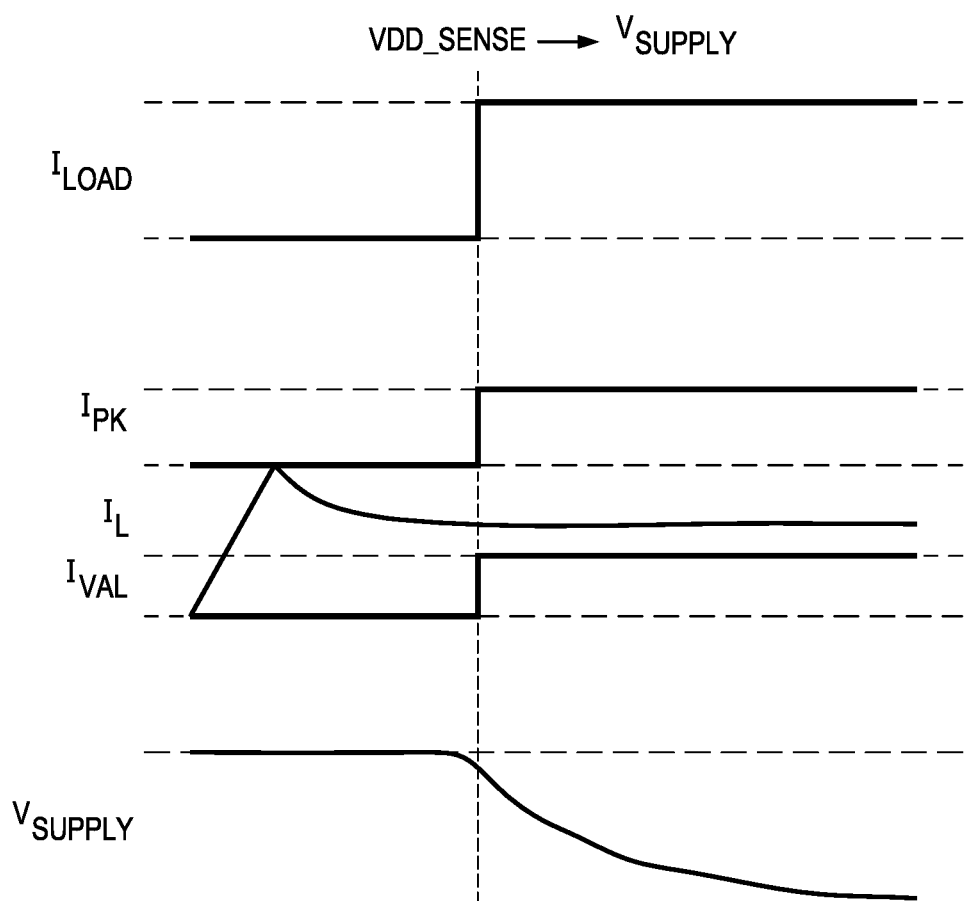
FIG. 18B illustrates graphs of example waveforms for an output current of a boost converter, boost converter inductor current, and an output voltage of the boost converter for very low duty cycles of a boost converter in response to a step in output current of the boost converter, in accordance with embodiments of the present disclosure.

Such increased transfer states in response to decreased duty cycles may cause undesirable sag in supply voltage $V_{SUPPLY}$, particularly during high-loading scenarios at the output of boost converter 20. To demonstrate, FIG. 18A illustrates graphs of example waveforms for an output current load current $I_{LOAD}$ of boost converter 20, boost converter inductor current $I_L$, and supply voltage $V_{SUPPLY}$ generated by boost converter 20 for typical duty cycles of boost converter 20 in response to a step in load current $I_{LOAD}$, in accordance with embodiments of the present disclosure. FIG. 18B illustrates graphs of example waveforms for output current load current $I_{LOAD}$ of boost converter 20, boost converter inductor current $I_L$, and supply voltage $V_{SUPPLY}$ generated by boost converter 20 for very low duty cycles of boost converter 20 in response to a step in load current $I_{LOAD}$, in accordance with embodiments of the present disclosure.

As described above, an increase in load current $I_{LOAD}$ may cause load estimator 44 in concert with current controller 46 to increase load to increase peak current threshold $I_{pk}$ and valley current threshold $I_{val}$, as shown in each of FIGS. 18A and 18B. Such increase typically increases an average current delivered to the electrical node of supply voltage $V_{SUPPLY}$, thus maintaining regulation of supply voltage $V_{SUPPLY}$, as shown in FIG. 18A. However, as the ratio of supply voltage $V_{SUPPLY}$ to voltage VDD_SENSE approaches 1 (or stated another way, as voltage VDD_SENSE approaches supply voltage $V_{SUPPLY}$), decrease in duty cycle of boost converter 20 may lead to a scenario shown in FIG. 18B in which inductor current $I_L$ never decreases to valley current threshold $I_{val}$, meaning inductor current $I_L$ may cease to be regulated by peak current threshold $I_{pk}$ and valley current threshold $I_{val}$. As a result, the average current delivered to the electrical node of supply voltage $V_{SUPPLY}$ may not increase during the step increase of load current $I_{LOAD}$, which means boost converter 20 may cease to regulate supply voltage $V_{SUPPLY}$, leading to an undesirable sag in supply voltage $V_{SUPPLY}$.

Figure 19:
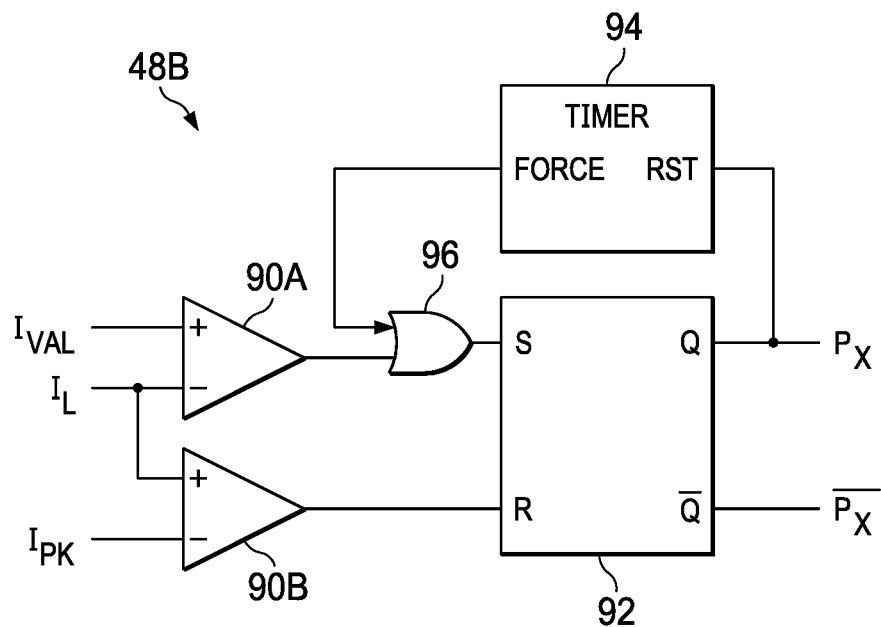
FIG. 19 illustrates a block diagram of selected components of an example peak/valley controller with further improvements over the example peak/valley controller of FIG. 16, in accordance with embodiments of the present disclosure.

FIG. 19 illustrates a block diagram of selected components of an example peak/valley controller 48B with further improvements over peak/valley controller 48A of FIG. 16, in accordance with embodiments of the present disclosure. In some embodiments, peak/valley controller 48B may be used to implement peak/valley controller 48 shown in FIG. 5. Further, peak/valley controller 48B shown in FIG. 19 may be similar in many respects to peak/valley controller 48A shown in FIG. 16, and thus only certain differences between peak/valley controller 48B and peak/valley controller 48A are described below. Peak-valley controller 48B may be implemented in analog circuitry, digital circuitry, or a combination thereof.

Figure 20:
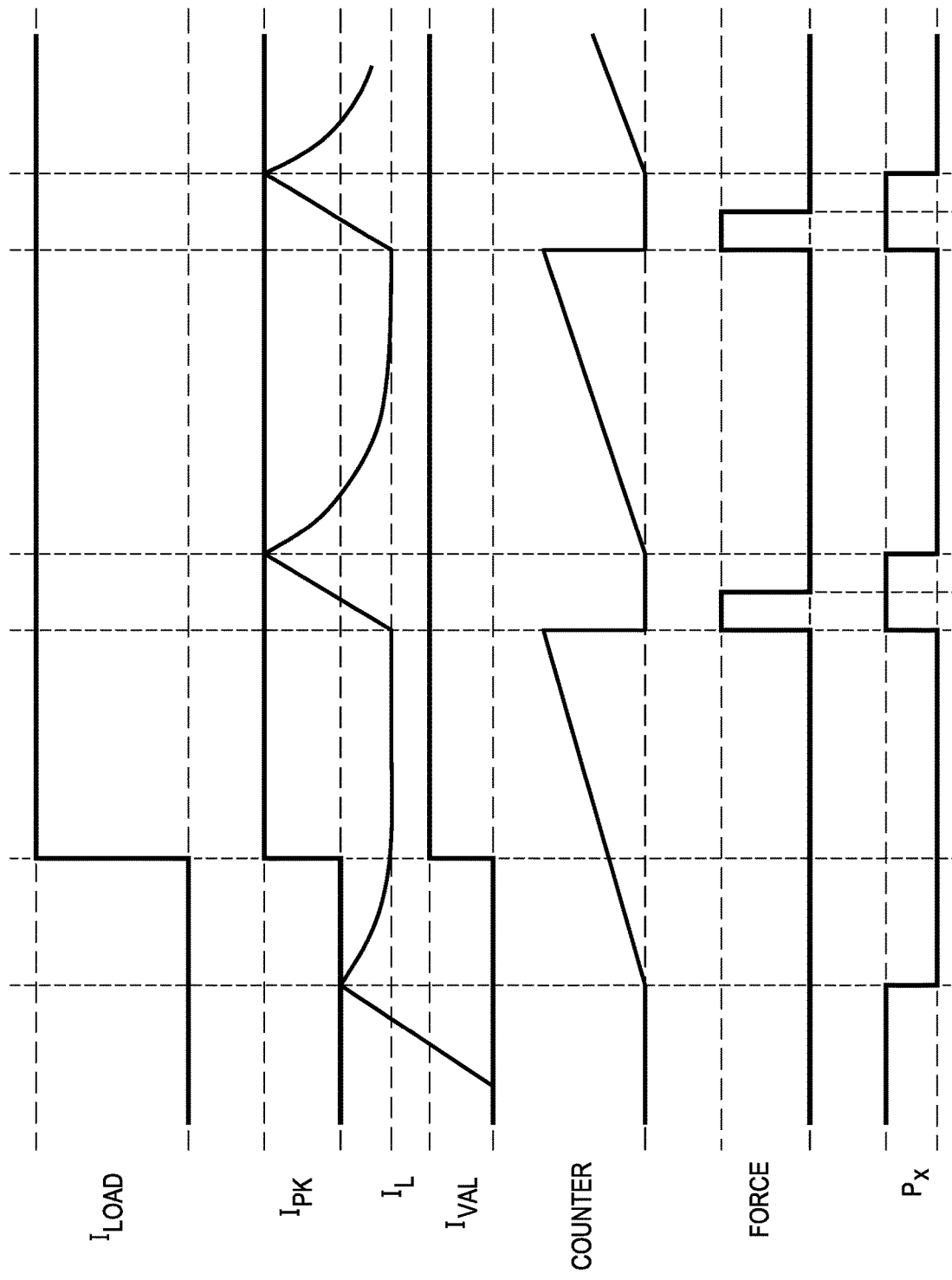
FIG. 20 illustrates graphs of example waveforms for an output current of a boost converter, boost converter inductor current, a timer counter, and a timer output signal for very low duty cycles of a boost converter using the example peak/valley controller shown in FIG. 19, in response to a step in output current of the boost converter, in accordance with embodiments of the present disclosure.

FIG. 20 illustrates graphs of example waveforms for load current $I_{LOAD}$ of boost converter 20, boost converter inductor current $I_L$, a counter internally maintained by timer 94, force signal FORCE generated by timer 94, and control signal $P_x$ for very low duty cycles of boost converter 20 using the example peak/valley controller 48B in response to a step in load current $I_{LOAD}$, in accordance with embodiments of the present disclosure.

One difference between peak/valley controller 48B and peak/valley controller 48A is that peak/valley controller 48B may include a timer 94 configured to hold in reset when control signal $P_x$ is asserted (e.g., when control signal $P_x$ is high). When control signal $P_x$ is deasserted (i.e., when boost converter 20 enters its transfer state), timer 94 may begin timing a duration of the transfer state. If the transfer state exceeds a predetermined maximum duration, timer 94 may assert a force signal FORCE.

As also shown in FIG. 19, peak/valley controller 48B may include a logical OR gate 96 that performs a logical OR operation of the output of comparator 90A with force signal FORCE. As a result, if, after the start of a transfer state of boost converter 20, inductor current $I_L$ fails to decrease to valley current threshold $I_{val}$ within the predetermined maximum duration of timer 94, timer 94 may assert force signal FORCE to force an end to the transfer state and begin a new charging state. Accordingly, even if inductor current $I_L$ fails to decrease to valley current threshold $I_{val}$, boost converter 20 is still able to periodically increase inductor current $I_L$, and thus, cause inductor current $I_L$ to periodically reach peak current threshold $I_{pk}$ such that inductor current $I_L$ may be regulated by peak current threshold $I_{pk}$, in turn allowing boost converter 20 to maintain current control and regulation of supply voltage $V_{SUPPLY}$.

One potential disadvantage of peak/valley controller 48B may occur in digital implementations of some or all of the components of peak/valley controller 48B. To illustrate, in peak/valley controller 48B, control signal $P_x$ may be converted to a discrete time signal using a zero-order-hold circuit (e.g., a synchronizer, series of latches, etc.). In such a digital implementation, if a pulse width of control signal $P_x$ is less than one digital sampling period, the digital circuitry implementing peak/valley controller 48B may fail to detect such pulse.

Figure 21:
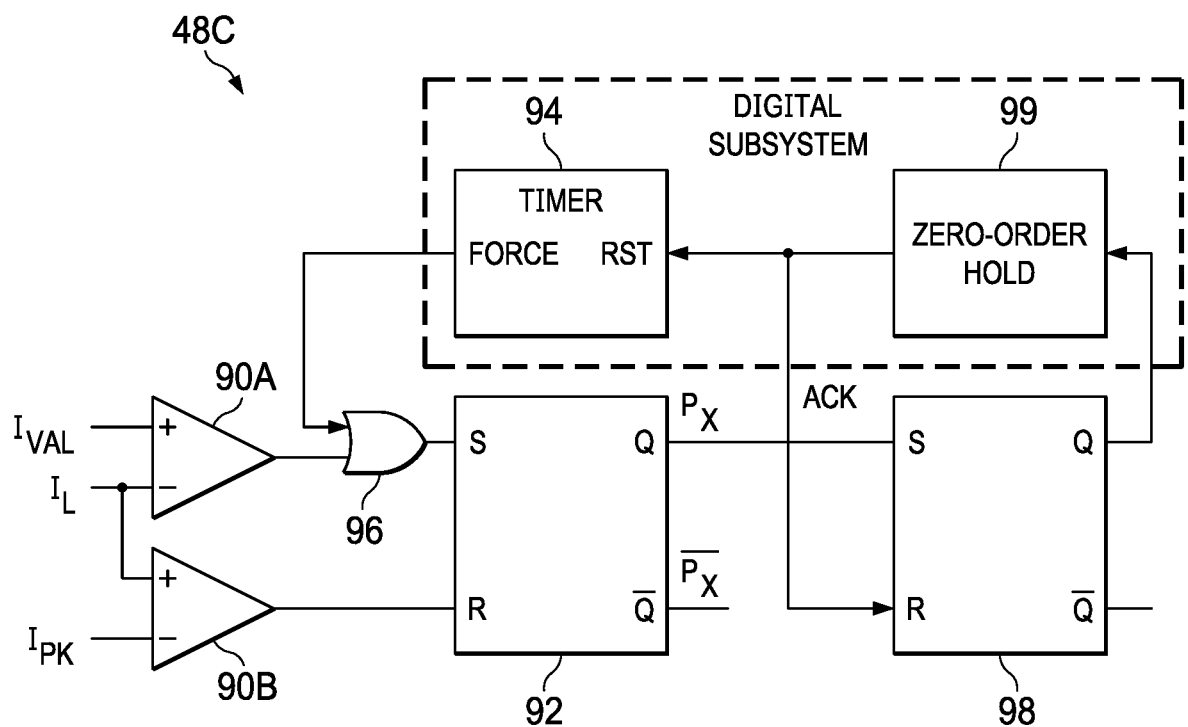
FIG. 21 illustrates a block diagram of selected components of an example peak/valley controller with further improvements over the example peak/valley controllers of FIG. 16 and FIG. 19, in accordance with embodiments of the present disclosure.

FIG. 21 illustrates a block diagram of selected components of an example peak/valley controller 48C with further improvements over peak/valley controller 48B of FIG. 19, in accordance with embodiments of the present disclosure. In some embodiments, peak/valley controller 48C may be used to implement peak/valley controller 48 shown in FIG. 5. Further, peak/valley controller 48C shown in FIG. 21 may be similar in many respects to peak/valley controller 48B shown in FIG. 19, and thus only certain differences between peak/valley controller 48C and peak/valley controller 48B are described below.

As shown in FIG. 21, in addition to those components of peak/valley controller 48B, peak/valley controller 48C may include a second set-reset latch 98 and a zero-order hold circuit 99. In operation, the set input of set-reset latch 98 may receive control signal $P_x$. Even if control signal $P_x$ is of short duration, set-reset latch 98 may assert its output Q until set-reset latch 98 is reset. Once the output Q of set-reset latch 98 is asserted, a digital subsystem comprising timer 94 and zero-order hold circuit 99 may measure output Q of set-reset latch 98 during its next clock cycle using zero-order hold circuit 99. The sampled output of zero-order hold circuit 99 may be received by timer 94 in order to reset timer 94, and such sampled output may also be received by the reset input of set-reset latch 98 in order to serve as an acknowledge signal ACK to reset set-reset latch 98. Accordingly, the inclusion of second set-reset latch 98 and zero-order hold circuit 99 may ensure that timer 94 does not miss any pulses of control signal $P_x$. As a possible variation to the embodiments represented by FIG. 21, in some embodiments, set-reset latch 98 may be configured as a set-dominant latch to prevent unnecessary toggling of its output should control signal $P_x$ remain asserted for more than one digital clock cycle.

One potential disadvantage of peak/valley controller 48C may result from processing delays which may delay force signal FORCE and acknowledge signal ACK by one or more digital clock signals. Due to such delay, control signal $P_x$ may be asserted for too long, potentially causing overshoot of inductor current $I_L$ well above peak current threshold $I_{pk}$. Such overshoot may result in inductor saturation and damage to circuitry of boost converter 20.

Figure 22:
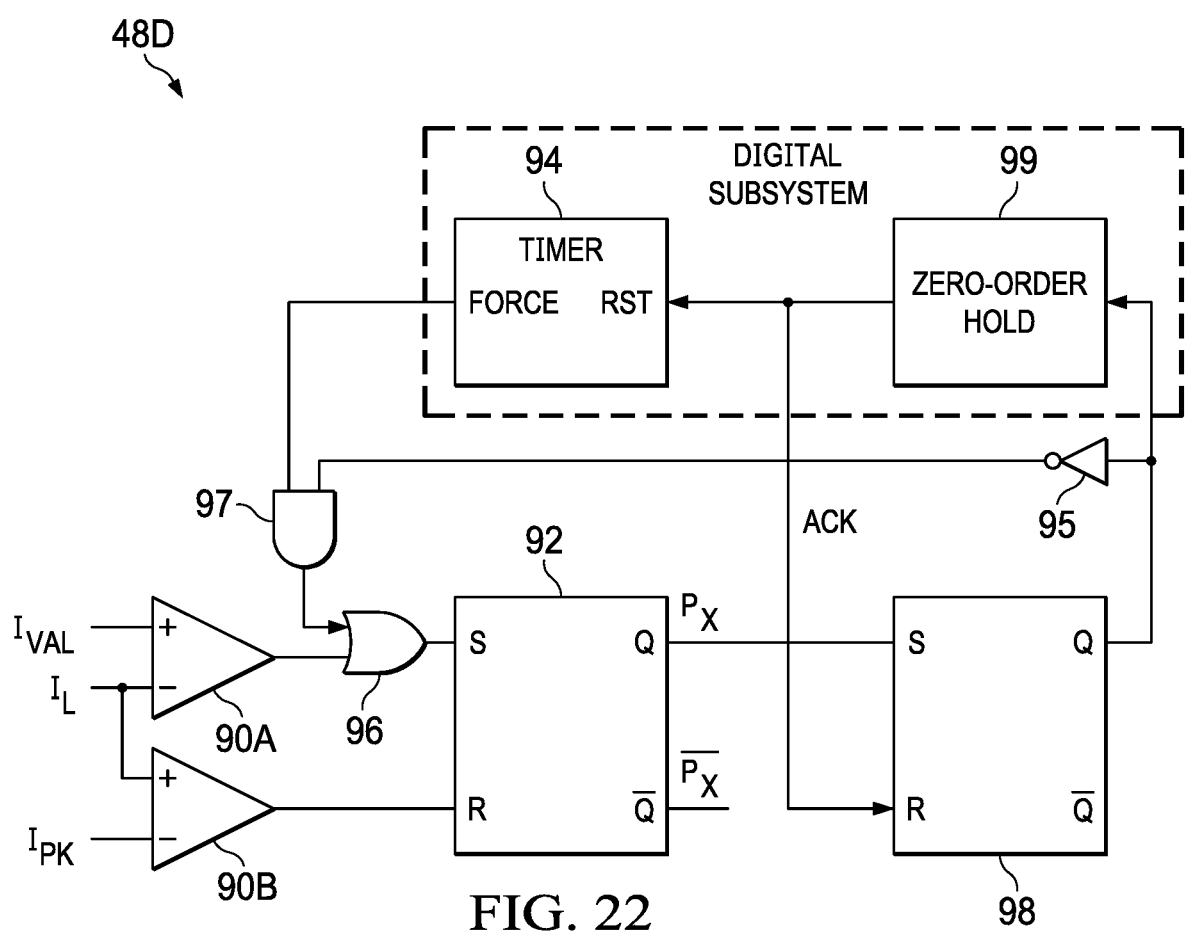
FIG. 22 illustrates a block diagram of selected components of an example peak/valley controller with further improvements over the example peak/valley controllers of FIG. 16, FIG. 20, and FIG. 21, in accordance with embodiments of the present disclosure.

FIG. 22 illustrates a block diagram of selected components of an example peak/valley controller 48D with further improvements over peak/valley controller 48C of FIG. 21, in accordance with embodiments of the present disclosure. In some embodiments, peak/valley controller 48D may be used to implement peak/valley controller 48 shown in FIG. 5. Further, peak/valley controller 48D shown in FIG. 22 may be similar in many respects to peak/valley controller 48C shown in FIG. 21, and thus only certain differences between peak/valley controller 48D and peak/valley controller 48C are described below.

As shown in FIG. 22, in addition to those components of peak/valley controller 48C, peak/valley controller 48D may include a logical AND gate 97. Logical AND gate 97 may perform a logical AND operation of force signal FORCE and the complementary output Q of set-reset latch 98 logically inverted by inverter 95. As a result, logical AND gate 97 may mask out any erroneous assertions of force signal FORCE that may result from digital processing delays of any digital circuitry used to implement peak/valley controller 48D.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for controlling a current associated with a power converter, comprising:
   controlling the current based on at least a peak current threshold level for the current and a valley current threshold level for the current;
   controlling the current based on the duration of time that the power converter spends in a switching state of the power converter;
   measuring a duration of time that the power converter spends in a switching state of the power converter with a timer, wherein the switching state is a transfer state of the power converter in which the current decreases;
   resetting the timer at the start of the switching state; and
   holding the timer in reset during a duration of a charging state of the power converter in which the current increases.

2. The method of claim 1, further comprising switching the power converter between a charging state in which the current increases and a transfer state in which the current decreases.

3. The method of claim 2, further comprising switching the power converter between the transfer state and the charging state based on the duration of time.

4. The method of claim 3, wherein the duration of time comprises a duration of time of the transfer state, and the method further comprises switching the power converter from the transfer state to the charging state if the duration of time exceeds a threshold duration.

5. The method of claim 1, further comprising holding the timer in reset until generation and receipt of an acknowledgment signal indicating the timer has registered a change in switching state of the power converter.

6. The method of claim 5, further comprising compensating for signal delays of digital components of the timer that affect one or both of the acknowledgement signal and a signal used to force a change in switching state in response to the timer exceeding a threshold duration.

7. A method for controlling a current associated with a power converter, further comprising:
   controlling the current based on at least a peak current threshold level for the current and a valley current threshold level for the current;
   controlling the current based on the duration of time that the power converter spends in a switching state of the power converter;
   measuring a duration of time that the power converter spends in a switching state of the power converter with a timer, wherein the switching state is a transfer state of the power converter in which the current decreases;
   resetting the timer at the start of the switching state; and
   resetting the timer upon generation and receipt of an acknowledgment signal indicating the timer has registered a change in switching state of the power converter.

8. The method of claim 7, further comprising switching the power converter between a charging state in which the current increases and a transfer state in which the current decreases.

9. The method of claim 8, further comprising switching the power converter between the transfer state and the charging state based on the duration of time.

10. The method of claim 9, wherein the duration of time comprises a duration of time of the transfer state, and the method further comprises switching the power converter from the transfer state to the charging state if the duration of time exceeds a threshold duration.

11. A control circuit for controlling a current associated with a power converter, the control circuit comprising:
    threshold-based control circuitry configured to control the current based on at least a peak current threshold level for the current and a valley current threshold level for the current; and
    timer-based control circuitry configured to:
        control the current based on a duration of time that the power converter spends in a switching state of the power converter, wherein the switching state is a transfer state of the power converter in which the current decreases;
        measure the duration of time with a timer;
        reset the timer at the start of the switching state; and
        hold the timer in reset during a duration of a charging state of the power converter in which the current increases.

12. The control circuit of claim 11, wherein the control circuit is configured to switch the power converter between a charging state in which the current increases and a transfer state in which the current decreases.

13. The control circuit of claim 12, wherein the timer-based control circuitry is configured to switch the power converter between the transfer state and the charging state based on the duration of time.

14. The control circuit of claim 13, wherein the duration of time comprises a duration of time of the transfer state, and the timer-based control circuitry is configured to switch the power converter from the transfer state to the charging state if the duration of time exceeds a threshold duration.

15. The control circuit of claim 11, wherein the timer-based control circuitry is further configured to hold the timer in reset until generation and receipt of an acknowledgment signal indicating the timer has registered a change in switching state of the power converter.

16. The control circuit of claim 15, further comprising compensation circuitry configured to compensate for signal delays of digital components of the timer that affect one or both of the acknowledgement signal and a signal used to force a change in switching state in response to the timer exceeding a threshold duration.

17. A control circuit for controlling a current associated with a power converter, the control circuit comprising:
    threshold-based control circuitry configured to control the current based on at least a peak current threshold level for the current and a valley current threshold level for the current; and
    timer-based control circuitry configured to:
        control the current based on a duration of time that the power converter spends in a switching state of the power converter, wherein the switching state is a transfer state of the power converter in which the current decreases;
        measure the duration of time with a timer;
        reset the timer at the start of the switching state; and
        reset the timer upon generation and receipt of an acknowledgment signal indicating the timer has registered a change in switching state of the power converter.

18. The control circuit of claim 17, wherein the control circuit is configured to switch the power converter between a charging state in which the current increases and a transfer state in which the current decreases.

19. The control circuit of claim 18, wherein the timer-based control circuitry is configured to switch the power converter between the transfer state and the charging state based on the duration of time.

20. The control circuit of claim 19, wherein the duration of time comprises a duration of time of the transfer state, and the timer-based control circuitry is configured to switch the power converter from the transfer state to the charging state if the duration of time exceeds a threshold duration.

\* \* \* \* \*